United States Patent
Koike et al.

(10) Patent No.: US 7,455,785 B2
(45) Date of Patent: Nov. 25, 2008

(54) METHOD OF DETERMINING A FLATNESS OF AN ELECTRONIC DEVICE SUBSTRATE, METHOD OF PRODUCING THE SUBSTRATE, METHOD OF PRODUCING A MASK BLANK, METHOD OF PRODUCING A TRANSFER MASK, POLISHING METHOD, ELECTRONIC DEVICE SUBSTRATE, MASK BLANK, TRANSFER MASK, AND POLISHING APPARATUS

(75) Inventors: Kesahiro Koike, Tokyo (JP); Masato Ohtsuka, Tokyo (JP); Yasutaka Tochihara, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 11/114,002

(22) Filed: Apr. 26, 2005

(65) Prior Publication Data
US 2005/0186691 A1    Aug. 25, 2005

Related U.S. Application Data

(62) Division of application No. 10/401,770, filed on Mar. 31, 2003, now Pat. No. 6,951,502.

(30) Foreign Application Priority Data

| Mar. 29, 2002 | (JP) | 2002-93479 |
| Mar. 29, 2002 | (JP) | 2002-93491 |

(51) Int. Cl.
*B44C 1/22* (2006.01)
*C25F 3/00* (2006.01)

(52) U.S. Cl. .............. 216/12; 216/57; 438/14; 438/690

(58) Field of Classification Search ............ 438/14, 438/690; 216/12, 57
See application file for complete search history.

(56) References Cited

U.S. PATENT DOCUMENTS

| 3,676,960 A | 7/1972 | Aspden |
| 4,393,127 A | 7/1983 | Greschner et al. |
| 5,951,374 A | 9/1999 | Kato et al. |
| 6,093,089 A * | 7/2000 | Chen et al. .................. 451/288 |
| 6,325,696 B1 | 12/2001 | Boggs et al. |
| 6,333,961 B1 | 12/2001 | Murakami |
| 6,336,853 B1 | 1/2002 | Schultz et al. |

(Continued)

FOREIGN PATENT DOCUMENTS

JP    64-002861 A    1/1989

(Continued)

OTHER PUBLICATIONS

S. Wolf and R.N. Tauber, (Silicon Processing for the VLSI Era, vol. 1—Process Technology, Lattice Press, 1986)(p. 550)☐☐.*

(Continued)

*Primary Examiner*—Duy-Vu Deo
*Assistant Examiner*—Mahmoud Dahimene
(74) *Attorney, Agent, or Firm*—Sughrue Mion, PLLC

(57) ABSTRACT

A flatness of a substrate is determined to achieve a desired flatness of a mask blank by predicting the variation in flatness resulting from a film stress of a thin film formed on the substrate. The flatness is adjusted by measuring the flatness of the substrate as a measured flatness, selecting a load type with reference to the measured flatness, and polishing the substrate under pressure distribution specified by the load type. A principal surface of the substrate has a flatness greater than 0 μm and not greater than 0.25 μm. A polishing apparatus includes a rotatable surface table, a polishing pad formed thereon, abrasive supplying means for supplying an abrasive to the polishing pad, substrate holding means, and substrate pressing means for pressing the substrate. The substrate pressing means has a plurality of pressing members for individually and desirably pressing a plurality of divided regions of the substrate surface.

6 Claims, 12 Drawing Sheets

U.S. PATENT DOCUMENTS

| | | |
|---|---|---|
| 6,447,368 B1 | 9/2002 | Fruitman et al. |
| 6,468,131 B1 | 10/2002 | Korovin |
| 6,638,140 B2 * | 10/2003 | Kimura et al. .................. 451/6 |
| 6,781,779 B2 * | 8/2004 | Arita et al. ..................... 360/59 |
| 6,855,908 B2 | 2/2005 | Takeuchi et al. |
| 6,899,979 B1 * | 5/2005 | Mitsui et al. ................... 430/5 |
| 6,905,398 B2 * | 6/2005 | Jeong ........................... 451/57 |
| 2001/0001755 A1 | 5/2001 | Sandhu et al. |
| 2002/0028395 A1 * | 3/2002 | Tanaka et al. .................. 430/5 |
| 2002/0068228 A1 * | 6/2002 | Kureishi et al. ................ 430/5 |
| 2002/0098422 A1 * | 7/2002 | Nozawa ......................... 430/5 |
| 2003/0104698 A1 | 6/2003 | Taniguchi et al. |

FOREIGN PATENT DOCUMENTS

| | | |
|---|---|---|
| JP | 64-40267 | 2/1989 |
| JP | 61-96456 A | 7/1994 |
| JP | 71-30686 B2 | 5/1995 |
| JP | 2000-094301 A | 4/2000 |
| JP | 2000-094302 A | 4/2000 |
| JP | 2002-46059 | 2/2002 |
| JP | 2002-316835 A | 10/2002 |

OTHER PUBLICATIONS

Di Mola et al. (Optoelectronic and Microelectronic Materials Devices, 1998. Proceedings. 1998 Conference on Dec. 14-16, 1998 pp. 411-414).*

Katsuhiko Furukawa (J. Appl. Phys. 84(8) 1998, pp. 4579-4584).*

Brinkmann, Sven: Verfahren zur Prüfung stabförmiger technischer Objekte mittels computer-generierter Hologramme und Interferometrie mit streifender Inzidenz, doctoral thesis, Erlangen, Jun. 23, 1999, pp. 5-11, 18-24, 45-50.

* cited by examiner

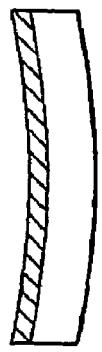
FIG. 1A  FIG. 1B  FIG. 1C

METHOD OF DETERMINING A FLATNESS OF AN ELECTRONIC DEVICE SUBSTRATE, METHOD OF PRODUCING THE SUBSTRATE, METHOD OF PRODUCING A MASK BLANK, METHOD OF PRODUCING A TRANSFER MASK, POLISHING METHOD, ELECTRONIC DEVICE SUBSTRATE, MASK BLANK, TRANSFER MASK, AND POLISHING APPARATUS This is a divisional of application Ser. No. 10/401,770 filed Mar. 31, 2003 now U.S. Pat. No. 6951502; the disclosure of which is incorporated herein by reference.

BACKGROUND OF THE INVENTION

This invention relates to a method of determining a flatness of an electronic device substrate used in a mask blank, a method of producing the substrate adjusted in flatness, a method of producing a mask blank, a method of producing a transfer mask, and a polishing method. This invention also relates to an electronic device substrate (such as a mask blank substrate) having a high flatness and a high parallelism, a mask blank and a transfer mask using the substrate, and a polishing apparatus.

Upon production of a semiconductor integrated circuit device, a photolithography technique is used in a process of forming a wiring region and other various regions. In a photolithography process using the photolithography technique, a photomask is used as an original pattern for exposure. The photomask comprises a transparent substrate and a light shielding thin film formed thereon and having a pattern. The pattern of the light shielding thin film is transferred by an exposure apparatus onto a semiconductor wafer (or an objective substrate). Thus, the semiconductor integrated circuit device is produced. The pattern transferred onto the semiconductor wafer has characteristics depending upon a flatness of the photomask. Therefore, the transparent substrate used in the photomask is required to have a high flatness. The flatness of the transparent substrate is defined as a difference between the maximum height and the minimum height of a surface of the transparent substrate, more specifically, a difference between the maximum height and the minimum height of a measured surface with respect to a virtual absolute plane calculated from the measured surface by a least square method. At present, a high flatness on the order of 1 μm is achieved in the transparent substrate used in the photomask as a result of improvement of a polishing pad, improvement of abrasive grains, and control of a polishing condition.

Although such a high flatness of the transparent substrate is achieved as described above, the total flatness of a photomask blank as a material of the photomask is deteriorated by the thin film formed on the transparent substrate because the thin film itself has a film stress. The deterioration in total flatness of the photomask blank results in degradation of a pattern position accuracy when the thin film is patterned and the photomask is produced. Accordingly, when the pattern is transferred onto the semiconductor wafer, a pattern displacement error or a pattern defect will be caused to occur.

In view of the above, it is attempted to reduce the film stress of the thin film formed on the transparent substrate by changing a depositing condition or a film material. However, in a recent semiconductor integrated circuit more and more increased in density and accuracy, such a reduced film stress of the thin film is yet unnegligible. In particular, in order to obtain a desired optical characteristic, the thin film formed on the transparent substrate tends to be multilayered. It is therefore difficult to control the film stress of the thin film.

On the other hand, a transparent substrate for an electronic device is different in flatness one by one and its surface may have a convex or a concave shape.

If the photomask blank or the photomask is produced by the use of the transparent substrate different in shape, the photomask blank or the photomask is deteriorated in flatness. This results in degradation of a pattern position accuracy when the thin film is patterned and the photomask is produced. Accordingly, when the pattern is transferred onto the semiconductor wafer, a pattern displacement error or a pattern defect will be caused to occur.

Following the recent development of a VLSI device having a higher density and a higher accuracy, an electronic device substrate (such as a mask blank substrate) is required to have a microscopic or ultrafine surface as a substrate surface. The above-mentioned demand becomes more and more strict year by year.

In recent years, not only for a surface defect (such as a flaw) on the substrate surface and a surface roughness (smoothness) but also for a profile accuracy (flatness) of the substrate, requirements become more and more strict. There arises a demand for a mask blank substrate having an ultra high flatness.

For example, the mask blank substrate is disclosed in Japanese Unexamined Patent Publication JP 1-40267 A. In the publication, proposal is made of a precision polishing method intended to reduce the surface roughness of the substrate surface. The method is a so-called batch-type method in which a plurality of substrates are simultaneously polished. The substrates are polished by the use of an abrasive comprising cerium oxide as a main component and thereafter finished by polishing using colloidal silica. A double-sided polishing technique (a twin polishing technique) using a double-sided polishing apparatus (a twin polishing apparatus) is described.

In the double-sided polishing technique using the double-sided polishing apparatus, a substrate having a high smoothness can be obtained by the use of abrasive grains having a small particle size. However, it is difficult to maintain an accuracy of the surface table within a wide plane of the surface table. Since a plurality of substrates are polished while rotating and revolving together with a carrier, it is impossible to modify the flatness of each individual substrate.

Even if polishing is performed by the use of the double-sided polishing apparatus improved in accuracy of the surface table and by adjusting a surface table cooling method, a slurry supplying method, and a polishing condition (the rotation speed of the surface table, the rotation speed and the revolution speed of the carrier, and so on), the flatness of a principal surface of the substrate (the flatness of the principal surface of the substrate in an area except a 3 mm zone from a side surface of the substrate) obtained after polishing has a limit of 0.5 μm in absolute value.

A design rule of a semiconductor integrated circuit corresponding to 0.5 μm as the flatness of the substrate of is equal to 180 nm. For a next-generation semiconductor integrated circuit, a design rule is expected to be 130 nm, 100 nm, 70 nm, and a yet smaller value. As described above, however, it is difficult to achieve a high-flatness substrate having a flatness not greater than 0.25 μg/m and adapted to be used as a substrate for a (ArF, $F_2$, EUV) mask corresponding to the design rule of the next-generation semiconductor integrated circuit.

Because of change in polishing condition (such as deterioration of the polishing pad and the abrasive grains) and because of the batch-type polishing method, it is difficult to produce a mask blank substrate at a high yield even if the flatness is between 0.5 μm and 1 μm. It is almost impossible to produce a high-flatness substrate having a flatness not greater than 0.5 μm, not greater than 0.25 μm, and so on adapted to the design rule of the next-generation semiconductor integrated circuit.

Following the recent development of a more and more miniaturized or finer pattern, a pattern width is reduced. As a consequence, the shape of a peripheral portion of the mask blank substrate affects a pattern position accuracy when the pattern on the mask is transferred to another substrate as an object by the use of a stepper. In this connection, it is desired that an entire area of the principal surface of the substrate (the principal surface of the substrate except the side surface and a chamfered face) has an excellent flatness. However, in the above-mentioned polishing method using the double-sided polishing apparatus, the flatness has a limit of about 1 μm.

Besides the above-mentioned polishing method using the double-sided polishing apparatus, JP 2002-46059 A discloses a polishing apparatus for a rectangular substrate. The polishing apparatus serves to flatten very small irregularities by uniformly removing a predetermined thickness of a surface of a wiring film or an insulator film formed on a rectangular large glass substrate of a liquid crystal display or a large-screen semiconductor sensor. The polishing apparatus includes a plurality of pressing means disposed on the side of a rear surface of the substrate. While the pressing means press the substrate against a polishing sheet, the substrate is rotated. Thus, the substrate is subjected to single-sided polishing. Each of the pressing means comprises a micrometer screw and a spring. By rotating the micrometer screw, an elastic force of the spring is adjusted to control a pressing force exerted upon the substrate.

The above-mentioned polishing apparatus is proposed to uniformly remove a part of the insulator film formed on a thin substrate having a thickness of 1.1 mm and is intended to improve the uniformity in thickness of the insulator film. However, for a thick substrate, such as a mask blank substrate, having a thickness of 6.5 mm (in case of a 6-inch substrate), the above-mentioned polishing apparatus can not effectively adjust the flatness of the substrate because the pressing force is insufficient. In the pressing means of the above-mentioned polishing apparatus, a spring thrust force must be changed depending upon the position of the micrometer screw. This can not easily be represented by data as a digital signal. Therefore, the pressing force is difficult to control.

SUMMARY OF THE INVENTION

It is therefore an object of this invention to provide a method of producing a mask blank including a thin film and a method of producing a transfer mask having a pattern, which are capable of achieving a desired flatness of the mask blank and a desired flatness of the transfer mask even if the thin film itself has a film stress and which are capable of avoiding deterioration in pattern position accuracy of the transfer mask as well as occurrence of a pattern displacement error and a pattern defect during pattern transfer.

It is another object of this invention to provide a method of determining a flatness of a substrate for an electronic device in order to achieve the above-mentioned object, and a method of producing a substrate for an electronic device.

It is still another object of this invention to provide a high-flatness electronic device substrate having a flatness not greater than 0.25 μm corresponding to a design rule of a next-generation semiconductor integrated circuit, and to provide a mask blank and a transfer mask produced by the use of the electronic device substrate.

It is yet another object of this invention to provide a novel polishing apparatus and a novel polishing method capable of reliably obtaining a high-flatness electronic device substrate having a flatness not greater than 0.25 μm.

It is a further object of this invention to provide a method of producing an electronic device substrate, which is capable of reliably obtaining, at a high yield, a high-flatness electronic device substrate having a flatness not greater than 0.25 μm corresponding to a design rule of a next-generation semiconductor integrated circuit, and methods of producing a mask blank and a transfer mask, which are capable of improving a pattern position accuracy when the transfer mask is produced by the use of the electronic device substrate and a pattern transfer accuracy during pattern exposure.

In order to achieve the above-mentioned object, this invention provides the following means.

(1) A method of determining a flatness of an electronic device substrate, in which the flatness of the substrate is determined so as to achieve a desired flatness of a mask blank including the substrate and a thin film formed on a principal surface thereof to cause an optical change in exposure light, the method including the steps of predicting and estimating the variation in flatness of the substrate resulting from a film stress of the thin film to be formed on the substrate and determining the flatness of the substrate so as to compensate the variation.

(2) A method of determining a flatness of an electronic device substrate, in which the flatness of the substrate is determined so as to achieve a desired flatness of a transfer mask including the substrate and a thin film pattern obtained by patterning a thin film formed on a principal surface of the substrate to cause an optical change in exposure light, the method including the steps of predicting and estimating the variation in flatness of the substrate resulting from a film stress of the thin film to be formed on the substrate and the variation in flatness resulting from at least one of the occupancy, the position, and the shape of the thin film pattern.

Herein, the flatness is defined as a difference between the maximum height and the minimum height of a surface profile of the principal surface of the substrate with respect to any reference plane determined on the principal surface (i.e., a difference between the maximum height and the minimum height of a measured surface with respect to a virtual absolute plane (focal plane) calculated from the measured surface by a least square method). A flatness measurement region may appropriately be selected but desirably covers an entire area of the principal surface.

Herein, "the variation in flatness resulting from a film stress of the thin film" is defined as a difference between the flatness of the substrate as a reference flatness and the flatness of the mask blank obtained by forming the thin film on the substrate (i.e., the flatness of the mask blank minus the flatness of the substrate).

Now, description will be made in detail about the method of calculating "the variation in flatness resulting from the film stress of the thin film".

Referring to FIG. 1A, the flatness of a substrate itself is measured and is equal to 0 μm. A thin film is formed on the substrate to obtain a mask blank. The flatness of the mask blank is measured and is equal to 1.1 μm (convex). In this event, the variation in flatness resulting from the film stress of the thin film is equal to 1.1 μm.

Referring to FIG. 1B, the flatness of a substrate itself is measured and is equal to 0 μm. A thin film is formed on the substrate to obtain a mask blank. The flatness of the mask blank is measured and is equal to 1.1 μm (concave). In this event, the variation in flatness resulting from the film stress of the thin film is equal to 1.1 μm.

However, it is practically impossible that the flatness of a substrate is equal to 0 μm. Referring to FIG. 1C, the flatness of a substrate itself is measured and is equal to 0.5 μm (convex). A thin film is formed on the substrate to obtain a mask blank. The flatness of the mask blank is measured and is equal to 1.6 μm (convex). In this event, the variation in flatness resulting from the film stress of the thin film is equal to 1.1 μm (=1.6−0.5).

Generally, in case where the thin film formed on the substrate has a compressive stress, the variation in flatness is positive (+). On the other hand, in case where the thin film formed on the substrate has a tensile stress, the variation in flatness is negative (−). Depending upon the material, the thickness, the depositing condition, and so on, the magnitude of the compressive stress or the tensile stress is different. Taking the above into account, a thin film is preliminarily and experimentally formed on a substrate having a known flatness under a depositing condition same as that in production of the mask blank and the variation in flatness resulting from the film stress of the thin film is measured. In this manner, the flatness of the substrate is determined so that the mask blank has an ideal flatness of 0 μm when it is produced. Thus, the mask blank having a high flatness can be obtained.

Herein, a desired flatness of the mask blank is not necessary equal to 0 μm. For example, the flatness of the substrate may be determined by predicting and estimating the variation in flatness resulting from stress variation caused by at least one of the aperture (or the occupancy), the position, and the shape of a mask (thin film) pattern when the transfer mask is obtained by patterning the thin film of the mask blank.

In case where the occupancy of the mask pattern is high (the aperture of the mask pattern is small), no remarkable stress variation occurs so that the variation in flatness is small with respect to the flatness of the mask blank as a reference. In case where the occupancy of the mask pattern is small, the stress variation is significant so that the variation in flatness is great.

In addition, it is assumed that, also depending upon the position and the shape of the thin film pattern, the stress variation will be caused with respect to the flatness of the mask blank as a reference.

Therefore, by predicting and estimating the variation in flatness resulting from at least one of the occupancy, the position, and the shape of the mask pattern of the transfer mask, the flatness of the substrate is determined so that the transfer mask has a desired flatness. Furthermore, the flatness of the substrate may be determined after the desired flatness of the mask blank is determined by predicting and estimating the variation in flatness when the transfer mask is produced and mounted to a stepper of an exposure apparatus.

Preferably, the flatness of the mask blank is not greater than 1 μm. The above-mentioned flatness is desirably obtained with respect to an entire area of the principal surface of the mask blank as a measurement region.

By suppressing the flatness of the mask blank to 1 μm or less, it is possible to reduce a pattern displacement error from a reference pattern position and to improve a pattern position accuracy when the transfer mask is produced by patterning the thin film. Thus, the flatness of the mask blank not greater than 1 μm is preferable. It is desired that the flatness of the mask blank is not greater than 0.5 μm, more preferably, not greater than 0.25 μm. The flatness not greater than 1 μm is represented by 0<flatness≦1 μm. This applies throughout the present specification.

Preferably, the flatness of the substrate is not greater than 1 μm.

The above-mentioned flatness is desirably obtained with respect to an entire area of the principal surface of the substrate as a measured region.

By suppressing the flatness of the substrate to 1 μm or less, it is possible to suppress the nonuniformity in flatness of the mask blank obtained by forming the thin film on the substrate and to further improve the pattern position accuracy when the transfer mask is produced by patterning the thin film. This is because, as the flatness of the substrate and the variation in flatness resulting from the thin film are smaller, the control is easier in achieving the absolute accuracy and the positional error of the pattern resulting from the variation in film stress is smaller when the transfer mask is produced.

The mask blank in this invention may be a transmissive mask blank and a reflective mask blank.

The thin film in this invention is a thin film for causing an optical change in exposure light. For example, the thin film may be a thin film having a function of shielding the exposure light, a thin film for causing a change in phase difference in the exposure light, a thin film having a function of absorbing the exposure light. Therefore, the term "mask blank" in this invention is used in a broad sense and includes a photomask blank in which only a light shielding thin film having a function of shielding exposure light is formed as a thin film, a phase shift mask blank in which a phase shift thin film having a phase shift function of causing a change in phase difference in the exposure light is formed as a thin film, and a reflective mask blank in which a reflective film having a function of reflecting the exposure light and an absorber film for absorbing the exposure light are formed as a thin film. The mask blank in this invention may have a resist film to serve as a mask when the thin film is patterned.

The method of adjusting the flatness of the substrate is not specifically restricted. For example, the flatness can be adjusted (controlled) by appropriately selecting a polishing method and a polishing condition for the substrate. Alternatively, the flatness of the substrate can be adjusted by locally modifying the flatness of the substrate, for example, by etching the principal surface of the substrate obtained after polishing.

The method of polishing the substrate may be a single-wafer polishing method of polishing the principal surface of the substrate one by one or a batch-type polishing method of polishing the principal surfaces of a plurality of substrates at one time.

The single-wafer polishing method is suitable for adjusting the flatness because polishing can be carried out while controlling the polishing condition such as surface pressure for each single substrate.

In the batch-type polishing method, a plurality of substrates are mounted on a work holder plate, called a carrier, arranged between a sun gear and an internal gear in a polishing apparatus. The carrier simultaneously performs revolution around the sun gear and rotation around its own axis to thereby polish the substrates. The flatness can be adjusted by changing the rotation speed and the revolution speed of the carrier, an accuracy of a surface table or a platen of the polishing apparatus, a polishing cloth attached to the surface table, abrasive grains, and so on.

As the method of locally modifying the flatness by etching or the like, use may be made of the following technique. For example, in case where a substrate material is silica glass generally used as a mask blank substrate, the flatness can be adjusted by removing a region inferior in flatness by dry etching using a mixed gas of an oxygen gas and a carbon fluoride gas.

As a preferable method of adjusting the flatness (method of producing an electronic device substrate), the following structure is advantageous because the flatness can precisely and strictly be controlled.

(3) A method of producing an electronic device substrate, the method comprising the steps of measuring the flatness of the substrate and adjusting the flatness of the substrate by locally etching and/or local-pressure polishing an area where the profile of a principal surface of the substrate is relatively convex with respect to any reference plane determined on the principal surface of the substrate, so that the substrate has a desired flatness determined by the method described in (1) or (2).

In order to adjust the flatness by etching, use may be made of a method of adjusting the flatness by supplying the area inferior in flatness with a dry etching gas such as a carbon fluoride gas to remove the area or a method of adjusting the flatness by supplying the area inferior in flatness with an etching solution corroding the substrate (in case of a glass substrate, an acid aqueous solution such as a fluoric acid or an alkali aqueous solution such as a sodium hydroxide) to remove the area.

In the above-mentioned methods of adjusting the flatness, the method of adjusting the flatness of the substrate by local-pressure polishing the substrate is preferable because the desired flatness can be achieved while maintaining or improving the surface roughness of the substrate. It is also possible to adjust the flatness by mechanochemical polishing (mechanical and chemical polishing) which is a combination of local-pressure polishing and etching. In this case, the productivity is improved because the polishing rate is increased as compared with the method of adjusting the flatness by local-pressure polishing.

(4) A method of producing an electronic device substrate as described in (3), wherein the flatness of the substrate is adjusted by the use of a polishing apparatus comprising a surface table rotatably supported, a polishing pad formed on the surface table, abrasive supplying means for supplying an abrasive to a surface of the polishing pad, substrate holding means for holding a substrate on the polishing pad, and substrate pressing means for pressing the substrate held on the polishing pad by the substrate holding means to thereby polish a substrate surface, the pressing means having a plurality of pressing members adapted to individually and desirably press a plurality of divided regions of the substrate surface, each pressing member having pressure control means capable of individually controlling a pressure applied to each corresponding one of the divided regions, the pressure control means controlling the pressing members so that a greater pressure is applied to a relatively convex area where the profile of a principal surface of the substrate is relatively convex with respect to any reference plane determined on the substrate surface than in a remaining area and that a part of a rear surface of the substrate opposite to the convex area is pressed by the pressing member under the greater pressure while the principal surface of the substrate is polished.

(5) A method of producing an electronic device substrate as described in (3) or (4), comprising the steps of preliminarily memorizing a plurality of load types corresponding to a plurality of pressure distributions in memory means, selecting as a selected load type an optimum one of the load types which is expected to provide a desired flatness, and polishing the substrate under the pressure distribution corresponding to the selected load type to thereby adjust the flatness of the substrate.

The electronic device substrate for use as a mask blank is different in flatness one by one. The principal surface of the substrate may have a convex or a concave shape.

If the mask blank or the transfer mask is produced by the use of the electronic device substrate different in shape, the mask blank or the transfer mask is deteriorated in flatness. This results in degradation of a pattern position accuracy when the thin film is patterned and the transfer mask is produced.

In view of the above, the substrate whose principal surface has a convex or a concave shape is polished by locally applying pressure to the relatively convex area where the surface is relatively convex with respect to any reference plane. In this manner, the convex area is selectively removed so that the flatness of the substrate is improved.

According to this invention, in order to achieve a desired flatness of the electronic device substrate, a plurality of load types corresponding to a plurality of pressure distributions are preliminarily memorized in the memory means and an optimum one of the load types which is expected to achieve the desired flatness is selected as a selected load type. Under the pressure distribution corresponding to the selected load type, the substrate is polished. Thus, the desired flatness of the substrate can be achieved. By selecting two or more load types in combination, it is possible to effectively approach the desired flatness.

The definition of the flatness and the measuring method are similar to those described in conjunction with (1).

(6) A method of producing a mask blank by forming, on a principal surface of an electronic device substrate, a thin film for causing an optical change in exposure light, the substrate having a desired flatness determined by a method described in (1) depending upon the thin film formed on the substrate.

(7) A method of producing a transfer mask by forming a thin film pattern on a principal surface of an electronic device substrate, the substrate having a desired flatness determined by a method described in (2) depending upon the thin film formed on the substrate and with reference to at least one of the occupancy, the position, and the shape of the thin film pattern formed on the principal surface of the substrate.

Upon producing the mask blank or the transfer mask, the substrate having a flatness determined by the method in (1) or (2) may be obtained by adjusting the flatness of the substrate by the method in any one of (3) through (5). Alternatively, a plurality of electronic device substrates obtained by the method in any one of (3) through (5) and measured for flatness are classified by the flatness. Upon production of the mask blank, one of the substrates which has an optimum flatness is selected.

(8) A method of producing a mask blank by forming a thin film made of chromium as a main component on a principal surface of an electronic device substrate by sputtering, the substrate having a convex shape as a surface profile of the principal surface on which the thin film is formed.

Generally, the thin film made of chromium as a main component and formed by sputtering has a tensile stress. Therefore, if the thin film is formed on the substrate, its surface profile is concave. In order to produce a mask blank having a high flatness, it is desirable to use a substrate having a convex shape as a surface profile of the principal surface on which the thin film is formed. The thin film made of chromium as a main component may be made of chromium as a single-element metal or may be made of chromium and at least one element selected from oxygen, nitrogen, and carbon. For example, use may be made of chromium oxide, chromium nitride, chromium carbide, chromium oxide nitride (oxynitride), chromium nitride carbide (carbonitride), chromium oxide carbide (oxycarbide), and chromium oxide nitride carbide (oxycarbonitride). The thin film made of chromium as a main component may comprise a single layer or a plurality of layers.

(9) A method of producing a mask blank by forming, on a principal surface of an electronic device substrate, a thin film comprising silicon as a main component and oxygen and/or nitrogen by sputtering, the substrate having a concave shape as a surface profile of the principal surface on which the thin film is formed.

Generally, the thin film comprising silicon as a main component and oxygen and/or nitrogen and formed by sputtering has a compressive stress. Therefore, if the thin film is formed on the substrate, its surface profile is convex. In order to produce a mask blank having a high flatness, it is desirable to use a substrate having a concave shape as a surface profile of the principal surface on which the thin film is formed. As a material for the thin film comprising silicon as a main component and oxygen and/or nitrogen, use is typically made of metal silicide oxide, metal silicide nitride, metal silicide oxide nitride (oxynitride), metal silicide oxide carbide (oxycarbide), metal silicide nitride carbide (carbonitride), metal silicide oxide nitride carbide (oxycarbonitride) (metal: transition element (Mo (molybdenum), Ta (tantalum), W (tungsten), or the like), silicon oxide, and silicon oxide nitride (oxynitride). The thin film comprising silicon as a main component and oxygen and/or nitrogen may have a single layer or a plurality of layers.

(10) A method of producing a mask blank as described in (8) or (9), wherein the substrate has a desired flatness determined by the method in (1).

(11) A method of producing a transfer mask by forming a thin film pattern on a principal surface of an electronic device substrate, the transfer mask being produced by the use of a mask blank obtained by the method in (8) or (9), the substrate having a desired flatness determined by the method in (2) depending upon the thin film formed on the substrate and with reference to at least one of the occupancy, the position, and the shape of the thin film pattern formed on the principal surface of the substrate.

In order to achieve the above-mentioned objects, this invention provides the following means.

(12) An electronic device substrate in which a principal surface of the substrate has a flatness greater than 0 μm and not greater than 0.25 μm (0.0<flatness≦0.25 μm).

Herein, the flatness is defined as a difference between the maximum height and the minimum height of a surface profile of a principal surface of a substrate with respect to any reference plane determined on the principal surface (i.e., a difference between the maximum height and the minimum height of a measured surface with respect to a virtual absolute plane calculated from the measured surface by a least square method).

The method of measuring the flatness is not specifically restricted. For example, use may be made of a contact type flatness measurement system using a probe or a non-contact type flatness measurement system utilizing optical interference. In view of a measurement accuracy and a measurement region (wide), the non-contact type flatness measurement system is preferable.

The measurement region is an area of the principal surface of the substrate except a 3 mm zone from a side surface of the substrate. Alternatively, the measurement region may include an area where the substrate is supported by a stepper of an exposure apparatus when a transfer mask, such as a photomask and a phase shift mask, is supported by the stepper to transfer a pattern onto a semiconductor wafer. Furthermore, the measurement region may include an auxiliary pattern forming area in a peripheral portion of the substrate where a quality assurance pattern or an alignment mark is formed. Preferably, the measurement region of the flatness covers an entire area of the principal surface of the substrate (the principal surface except the peripheral portion of the substrate (the side surface of the substrate and the chamfered face)), taking into account a transfer characteristic during pattern transfer.

In this invention, by polishing the substrate using a polishing apparatus which will later be described, the flatness of the entire area of the principal surface of the substrate (the principal surface except the side surface of the substrate and the chamfered face) can be assured.

The flatness of the principal surface of the substrate is preferably greater than 0 μm and not greater than 0.2 μm, more preferably greater than 0 μm and not greater than 0.15 μm. The substrate having the above-mentioned flatness can easily and reliably be produced by polishing the substrate on at least one of opposite principal surfaces thereof to control the profile of the substrate by the use of a polishing method and a polishing apparatus which will later be described. As the absolute value of the flatness of the substrate becomes smaller, the pattern position accuracy when the transfer mask is produced is improved and the pattern transfer accuracy when the pattern is transferred by the use of the transfer mask is improved. By selecting the flatness of the substrate within the above-mentioned range, it is possible to obtain an electronic device substrate excellent in reliability with respect to the pattern position accuracy and the pattern transfer accuracy.

The electronic device substrate referred to throughout the present specification is an angled (for example, a quadrilateral (square or rectangular)) substrate and includes a mask blank substrate or the like. Unlike a circular semiconductor wafer, the electronic device substrate mentioned in this invention has an angled shape. Generally, in case where a plurality of substrates of an angled shape are simultaneously polished by a batch-type double-sided polishing method on both of the opposite principal surfaces, the profile in each surface may become asymmetrical and the individual substrates may be different in flatness from one another. This invention is effectively applicable to the electronic device substrate of an angled shape which is difficult to control the flatness of the substrate in the double-sided polishing method (the twin polishing method).

(13) An electronic device substrate as described in (12), wherein the substrate has a parallelism greater than 0 μm and not greater than 1 μm.

Herein, the parallelism is defined by a difference in thickness between the maximum height and the minimum height of one principal surface with respect to the other principal surface as a reference plane. The measurement region of the parallelism is similar to the flatness measurement region mentioned above and will not be described any further.

The parallelism of the substrate is preferably greater than 0 μm and not greater than 0.8 μm, more preferably greater than 0 μm and not greater than 0.5 μm. The substrate having the above-mentioned parallelism can easily and reliably be produced by polishing the substrate on both of opposite principal surfaces thereof to control the profile of the substrate by the use of a polishing method and a polishing apparatus which will later be described. As the value of the parallelism of the substrate becomes smaller, the pattern position accuracy when the transfer mask is produced is improved and the pattern transfer accuracy when the pattern is transferred by the use of the transfer mask is improved. By selecting the parallelism of the substrate within the above-mentioned range, it is possible to obtain an electronic device substrate excellent in reliability with respect to the pattern position accuracy and the pattern transfer accuracy.

(14) An electronic device substrate as described in (12) or (13), wherein the substrate comprises a glass substrate.

The material of the glass substrate is not specifically limited. Generally, a silica glass, an alkali-free glass, a borosilicate glass, an aluminosilicate glass, and a soda lime glass are used as an electronic device substrate.

(15) A mask blank comprising an electronic device substrate described in any one of (12) through (14) and a transfer pattern thin film formed on a principal surface of the substrate to be patterned into a transfer pattern for an object.

The mask blank in this invention includes a transmissive mask blank and a reflective mask blank. The mask blank comprises a substrate and a transfer pattern thin film formed thereon. The transfer pattern thin film is patterned into a transfer pattern to be transferred to an object.

For example, the transmissive mask blank is a photomask blank comprising, as a substrate, a glass substrate which is a translucent substrate and, as a transfer pattern thin film, a thin film for causing an optical change in exposure light used in pattern transfer to the object (for example, a thin film having a light shielding function).

Herein, the term "mask blank" is used in a broad sense and includes a photomask blank provided with only an opaque film having a function of shielding exposure light and a phase shift mask blank provided with a phase shift film having a phase shift function of causing a change in phase difference in exposure light. The "mask blank" in this invention also includes a phase shift mask blank provided with a halftone film which is a semi-transmissive film having a function of shielding the exposure light and a phase shift function of causing a change in phase difference.

For example, the reflective mask blank comprises, as a substrate, a low-expansion glass substrate and, as a transfer pattern thin film, a reflective multilayer film formed on the substrate and an absorber film to serve as a transfer pattern.

In addition to the opaque film and/or the phase shift film as the transfer pattern thin film, the mask blank in this invention may include a resist film to serve as a mask when the opaque film or the phase shift film is patterned, and any other appropriate film (for example, a transparent conductive film).

(16) A transfer mask having a transfer pattern formed by patterning a transfer pattern thin film in a mask blank described in (15).

(17) A polishing apparatus comprising a surface table rotatably supported, a polishing pad formed on the surface table, abrasive supplying means for supplying an abrasive to a surface of the polishing pad, substrate holding means for holding a substrate on the polishing pad, and substrate pressing means for pressing the substrate held on the polishing pad by the substrate holding means to thereby polish a substrate surface;

the substrate holding means having a function of suppressing an excessive pressure exerted from the polishing pad upon a peripheral portion of the substrate;

the substrate pressing means having a plurality of pressing members adapted to individually and desirably press a plurality of divided regions of the substrate surface, each pressing member having pressure control means capable of individually controlling a pressure applied to each corresponding one of the divided regions.

The surface table requires a material and a thickness such that the surface table is not deformed at least under a working pressure. Since a surface table accuracy has an influence upon the flatness of the substrate, the surface table is desired to have a flatness as high as possible.

As a material of the surface table, use is preferably made of a stainless alloy, ceramics exhibiting no substantial thermal change, and low expansion cast iron. In order to maintain the accuracy (flatness) of the surface table, a surface table cooling mechanism may be provided.

The polishing pad may appropriately be selected depending upon a substrate material and a desired flatness. Generally, the polishing pad is classified into a hard polisher and a soft polisher. As the hard polisher, use may be made of an urethane pad, a pitch-impregnated pad, and a hard resin suede pad. As the soft polisher, use may be made of a suede pad and a nonwoven fabric.

The type and the particle size of the abrasive used in polishing may appropriately be selected depending upon a substrate material and a desired flatness. For example, the abrasive may be cerium oxide, zirconium oxide, and colloidal silica. The abrasive has a particle size between several tens nanometers and several micrometers.

The substrate holding means has a structure in which the substrate is prevented from being released during rotation and has a function of suppressing an excessive pressure exerted from the polishing pad against the peripheral portion of the substrate.

In order to hold the substrate, proposal is made of a method using a retainer ring (guide ring, dressing retainer) surrounding at least the side surface of the substrate so as not to damage the substrate, a method of sucking a rear surface of the substrate, and a method of holding the substrate with a carrier.

By pressing the polishing pad at an outer periphery of the substrate with the substrate holding means, it is possible to keep a uniform pressure applied to the peripheral portion of the substrate. As a consequence, the peripheral portion of the substrate has a uniform flatness. Thus, the profile of the peripheral portion of the substrate is also assured.

The substrate pressing means has a structure including a plurality of pressing members and pressing member holding means holding the pressing members.

The pressing members are uniformly distributed with respect to the principal surface of the substrate. The number of pressing members thus distributed may appropriately be adjusted depending upon a profile modification accuracy (flatness). A greater number of the pressing members with respect to the principal surface of the substrate is preferable because the profile can be controlled more and more strictly and precisely. For example, in case where the substrate has a size of 6 inch×6 inch (1 inch=2.54 mm), the number of the pressing members may be 4 (2×2) to 256 (16×16). Taking into account the simplification of the apparatus and the profile modification accuracy in combination, the number preferably falls within a range between 36 (6×6) to 144 (12×12). In an area where the principal surface of the substrate and the pressing members are brought into contact with each other an elastic member may be provided so as to prevent the principal surface of the substrate from being damaged.

In order to dispose the pressing members throughout a substantially entire area of the principal surface of the substrate, the pressing member holding means is substantially equal in size to the substrate and has a plurality of pressing member holding holes formed at predetermined intervals to hold the pressing members.

For example, the pressure control means may be an air cylinder, a hydraulic cylinder, and a servo motor.

The pressure control can be carried out continuously or stepwise by the use of a regulator or an additional current.

The surface table and the substrate holding means can be driven in rotation by individual rotation drives separate from each other.

(18) A polishing apparatus as described in (17), wherein the substrate holding means comprises a retainer ring surrounding an outer peripheral end face of the substrate.

The retainer ring serves to suppress transfer of an excessive pressure to the peripheral portion of the substrate to thereby achieve a uniform pressure applied to the peripheral portion of the substrate and to uniformly supply abrasive grains to the polishing pad. A gap between the side surface of the substrate and the retainer ring may appropriately be adjusted depending upon the shape of the peripheral portion of the substrate. In an area where the retainer ring is brought into contact with the side surface of the substrate, an elastic member may be provided.

(19) A polishing apparatus as described in (17) or (18), further comprising data processing means for measuring a profile of the substrate before polishing and/or during polishing to obtain measured data, memorizing the measured data, and comparing initial setting data for a desired shape with the measured data to calculate a working condition, and transmitting means for transmitting pressing information to the substrate holding means and the substrate pressing means so that the substrate has the desired shape.

For example, the working condition is calculated as follows. At first, the measured data obtained by measuring the profile (flatness) of the substrate are compared with the initial setting data to calculate a difference in flatness. In order that the profile (flatness) of the substrate coincides with the desired shape by removing the above-mentioned difference, calculation is made of the working condition of removing at least a relatively convex region of the measured surface with respect to any reference plane, taking into account the rotation direction and the rotating speed of the substrate and the surface table. Calculation of the working condition is carried out by data processing means such as a computer.

The working condition (processing information) obtained by the data processing means is transmitted to the substrate holding means and the substrate pressing means by transmitting means such as Ethernet communication, CPU COM communication, and CPU USB communication to control the working condition.

(20) A polishing apparatus as described in any one of (17) through (19), further comprising a pressing plate rotatably supported on the surface table to substantially uniformly press the principal surface of the substrate, and substrate defect removing means formed between the pressing plate and the surface table and having a carrier having a holding hole for holding the substrate so that the substrate is rotatable independently of the pressing plate.

The substrate defect removing means is a mechanism in which the principal surface of the substrate facing the surface table is polished by the surface table driven in rotation on the side of the pressing plate, a flaw or a foreign matter on the surface opposite to the surface modified in substrate profile (flatness) by the polishing apparatus in (17) is polished on the side of the surface table. Thus, while maintaining the surface modified in substrate profile (flatness) by the polishing apparatus in (17), a defect such as a flaw or a foreign matter can be removed.

Upon removing the defect on the substrate, the abrasive is supplied to both of the opposite principal surfaces of the substrate. The abrasive supplying means may be same as the abrasive supplying means in (17) but may be separately provided exclusively for the substrate defect removing means.

The surface of the pressing plate facing the substrate is provided with a polishing pad adhered thereto. The polishing pad is not specifically restricted but may appropriately be selected. However, in order to remove a defect such as a flaw or a foreign matter on the substrate surface and to prevent the substrate surface from being damaged by the polishing pad, a soft polisher or a ultra-soft polisher is preferably used. The pressing plate requires a material and a thickness sufficient to prevent deformation under the weight of the pressing plate and the working pressure. Since the accuracy of the surface table of the pressing plate has an influence upon the flatness of the substrate, the surface table is desired to have a flatness as high as possible.

As a material of the surface table, use is preferably made of a stainless alloy, ceramics exhibiting no substantial thermal change, and low-expansion cast iron. In order to maintain the accuracy (flatness) of the surface table of the pressing plate, a surface table cooling mechanism may be provided. The pressing plate is rotated around a rotation center at a position slightly offset from the center of the substrate.

The carrier is provided with one or a plurality of holding holes for holding the substrate or substrates and connected to a rotation drive so that the carrier is rotated independently of the pressing plate. The carrier is required to be made of a material having a mechanical durability so that the carrier is not deformed during rotation. Preferably, use may be made of a stainless steel, a vinyl chloride, and a plastic material.

The pressing plate and/or the carrier may be provided with wobbling means so that the pressing plate and/or the carrier is wobbled while the defect is removed.

(21) A polishing method using a polishing apparatus described in any one of (17) through (19), the method comprising the steps of preparing a substrate, measuring a profile of the substrate, suppressing an excessive pressure applied from the polishing pad to a peripheral portion of the substrate, controlling the pressing members by the pressure controlling means with reference to the measured data so that a pressure applied by the pressing member to the substrate is greater in a relatively convex area where the profile of a principal surface of the substrate is relatively convex with respect to any reference plane determined on a substrate surface than in a remaining area, polishing the principal surface of the substrate while pressing a part of a rear surface of the substrate opposite to the convex area to modify the profile of the substrate so that the profile of the substrate becomes a desired shape.

"Preparing a substrate" includes various substrates, such as a substrate after a lapping step, a substrate after a rough polishing step intended to remove a flaw on a principal surface of the substrate formed in the lapping step and to maintain the flatness obtained in the lapping step, and a substrate after a precision polishing step intended to process the principal surface of the substrate into a mirror surface. A lapping method and a polishing method carried out in the lapping step, the rough polishing step, and the precision polishing step are not specifically restricted. Use may be made of any possible combination of a single-sided lapping method, a double-sided lapping method, and the single-sided polishing method, and a double-sided polishing method.

Preferably, the polishing method of this invention is carried out after the precision polishing step intended to process the principal surface of the substrate into a mirror surface.

The reason is as follows. After precision polishing, protrusions having a flatness on the order of 0.5 μm are formed. It is effective to remove such a small amount by fine abrasive grains used in the precision polishing step.

The measurement of the flatness of the substrate is same as that described in conjunction with (12) and will not be described any further.

The polishing method of this invention will later be described in conjunction with an embodiment.

(22) A polishing method as described in (21), wherein both of opposite principal surfaces of the substrate are polished.

By executing the polishing method on both of the opposite principal surfaces, the parallelism of the substrate becomes excellent. This aspect is effective for a substrate required to be controlled in flatness and parallelism for both of the opposite principal surfaces. For example, a substrate adapted to the polishing method may be a mask blank substrate and an electronic device substrate.

(23) A polishing method comprising the steps of modifying the profile of a substrate by a method described in (21) or (22) and removing a defect on a principal surface of the substrate by the use of a polishing apparatus described in (20).

Since the defect on the principal surface of the substrate can be removed, it is possible to prevent occurrence of a film defect under a thin film in case where the thin film is formed on the principal surface of the substrate to produce an electronic device (for example, a photomask blank). Therefore, a highly reliable substrate can be obtained.

(24) A method of producing an electronic device substrate for use as a substrate of a mask blank, the method including a polishing method described in any one of (21) through (23).

(25) A method of producing an electronic device as described in (24), wherein the substrate is a quadrilateral (including square, rectangular) substrate having a predetermined area and a predetermined thickness having a relationship given by:

(predetermined thickness)/(predetermined area)$\geq 1.0 \times 10^{-4}$ mm$^{-1}$.

This invention is particularly effective to a substrate relatively thick with respect to a substrate area as represented by (predetermined thickness)/(predetermined area)$\geq 1.0 \times 10^{-4}$ mm$^{-1}$. In case of a substrate relatively thin with respect to a substrate area as represented by (predetermined thickness)/(predetermined area)$< 1.0 \times 10^{-4}$ mm$^{-1}$, the substrate is warped while the profile is locally modified. Thus, the latter substrate is difficult to control the flatness and is not preferable.

On the other hand, in case of the substrate relatively thick with respect to the substrate area as represented by (predetermined thickness)/(predetermined area)$\geq 1.0 \times 10^{-4}$ mm$^{-1}$, the substrate has a sufficient thickness so that the pressure applied by the substrate pressing means against the substrate is distributed in an in-plane direction and transmitted to a substrate thickness direction. Therefore, the change in polishing rate from a local area applied with the pressure to a surrounding area is gentle or moderate so that the relatively convex area and the surrounding area can gradually be polished. This improves controllability of the flatness. The pressure distribution in the in-plane direction of the substrate is different when the pressure is applied to the center portion of the substrate and when the pressure is applied to the peripheral portion of the substrate.

Taking into account the measured data of the substrate profile, the substrate thickness with respect to the substrate area, and the rotating directions and the rotating speeds of the substrate and the surface table, the pressure applied by the substrate pressing means to the substrate is controlled.

For example, the measured data of the substrate profile is convex, the pressing condition is determined, taking into account the substrate thickness with respect to the substrate area, so that the pressure applied by the substrate pressing means to the substrate is not concentrated exclusively to a local area or a relatively convex area but distributed to some extent to a relatively wide area in the substrate surface including the convex area. In case of a 6025 substrate having a relatively large thickness with respect to the substrate area (6 inch×6 inch×0.25 inch), the pressure distribution in the in-plane direction of the substrate is large. Therefore, the substrate is applied with a predetermined pressure only by the substrate pressing means disposed at the center portion of the substrate. In case of a 5009 substrate having a relatively small thickness with respect to the substrate area (5 inch×5 inch× 0.09 inch), the pressure distribution in the in-plane direction of the substrate is small. Therefore, the load (pressure) applied to the substrate by the substrate pressing means disposed at the center portion of the substrate is determined to be relatively large while the load (pressure) applied to the substrate by the substrate pressing means disposed at the peripheral portion of the substrate is determined to be relatively small.

If the substrate thickness is excessively large, the local area is not applied with the pressure by the substrate pressing means. Therefore, the ratio (predetermined thickness)/(predetermined area) of the substrate preferably falls within a range between $1.0 \times 10^{-4}$ mm$^{-1}$ and $4.0 \times 10^{-4}$ mm$^{-1}$ (both inclusive). If the ratio exceeds $4.0 \times 10^{-4}$ mm$^{-1}$, local pressure transfer by the substrate pressing means to the substrate in the thickness direction is difficult. The ratio (predetermined thickness)/(predetermined area) more preferably falls within a range between $1.3 \times 10^{-4}$ mm$^{-1}$ and $2.8 \times 10^{-4}$ mm$^{-1}$ (both inclusive).

(26) A method of producing a mask blank, comprising the step of forming a transfer pattern thin film on a principal surface of an electronic device substrate obtained by a method described in (24) or (25).

It is possible to obtain a mask blank excellent in pattern position accuracy when a transfer mask is produced and in pattern transfer accuracy during pattern exposure.

(27) A method of producing a transfer mask, comprising the step of patterning a transfer pattern thin film in a mask blank described in (26) to form a transfer pattern.

It is possible to obtain a transfer mask excellent in pattern position accuracy and in pattern transfer accuracy during pattern exposure.

(28) A method of producing an electronic device substrate, comprising the steps of holding a substrate in a holding hole of a carrier, clamping upper and lower surfaces of the substrate by upper and lower surface tables provided with polishing pads adhered thereto, and rotating the upper and the lower surface tables around an axis perpendicular to the upper and the lower surfaces of the substrates as worked surfaces so that the substrate held by the carrier perform frictional movement while rotating and revolving between the polishing pads to thereby execute double-sided polishing of the substrate, wherein:

the double-sided polishing is followed by measurement of the flatness of at least one of opposite principal surfaces of the substrate, the flatness of the substrate being modified by locally modifying, with reference to the measured data, the profile of the substrate in a relatively convex area where the profile is relatively convex with respect to any reference plane determined on one principal surface so that the flatness of the substrate becomes a desired value.

Herein, the flatness is defined as a difference between the maximum height and the minimum height of a surface profile of a principal surface of a substrate with respect to any reference plane determined on the principal surface (i.e., a difference between the maximum height and the minimum height of a measured surface with respect to a virtual absolute plane calculated from the measured surface by a least square method).

The method of measuring the flatness is not specifically restricted. For example, use may be made of a contact type flatness measurement system using a probe or a non-contact type flatness measurement system utilizing optical interference. In view of a measurement accuracy and a measurement region (wide), the non-contact type flatness measurement system is preferable.

The measurement region of the flatness is an area of the principal surface of the substrate except a 3 mm zone from a side surface of the substrate. Alternatively, the measurement region may include an area where the substrate is supported by a stepper of an exposure apparatus when a transfer mask such as a photomask and a phase shift mask is supported by the stepper to transfer a pattern onto a semiconductor wafer. Furthermore, the measurement region may include an auxiliary pattern forming area in a peripheral portion of the substrate where a quality assurance pattern or an alignment mark is formed. Preferably, the measurement region of the flatness covers an entire area of the principal surface of the substrate (the principal surface except the peripheral portion of the substrate (the side surface of the substrate and the chamfered face)), taking into account a transfer characteristic during pattern transfer.

Preferably, the flatness is measured for both of the opposite principal surfaces. With reference to the data measured for both of the opposite principal surfaces, a relatively convex area where the profile is relatively convex with respect to any reference plane determined on each surface is locally modified in profile. Thus, the parallelism of the substrate (i.e., a difference in thickness between the maximum height and the minimum height of one principal surface with respect to the other principal surface as a reference plane) is improved and the pattern transfer accuracy when the transfer mask is produced is improved.

The method of locally modifying the profile is not specifically restricted. Modification of the profile in this invention is preferably carried out for a single substrate at one time. As the method of locally modifying the profile, use may be made of a method of mechanically modifying the profile, a method of chemically modifying the profile, and a method of mechanically and chemically modifying the profile.

As the method of mechanically modifying the profile, use may be made of a method of modifying the profile by supplying a slurry containing abrasive grains to the substrate and moving a polishing pad or a polishing tape in frictional contact only with the relatively convex area, a method of modifying the profile by moving the polishing pad or the polishing tape in frictional contact with the substrate with a relatively greater pressure applied to the convex area, and a method of modifying the profile by spraying a liquid such as a slurry to the convex area.

As the method of chemically modifying the profile, use may be made of an etching method of corroding and removing a part of the substrate. As the etching method, wet etching and dry etching are available. In order to modify a specific area with high accuracy, the dry etching is preferable. As an etchant used in etching, a solution of a gas containing fluorine is suitable in case where the substrate is made of a glass containing $SiO_2$.

As the method of mechanically and chemically modifying the profile, use may be made of mechanochemical polishing in which the substrate is corroded and removed by abrasive grains.

In case where the double-sided polishing step is a multistage polishing step including a rough polishing step of polishing the substrate by the use of relatively large abrasive grains in order to maintain the flatness obtained in a lapping step and to remove a flaw formed in the substrate during the lapping step, and a precision polishing step of polishing the substrate by the use of relatively small abrasive grains in order to process the substrate into a mirror surface, the step of locally modifying the profile to modify the flatness of the substrate is preferably carried out after the precision polishing step of polishing the substrate by the use of the relatively small abrasive grains in order to process the substrate into a mirror surface, in particular, after a final precision polishing step. The abrasive grains used in the precision polishing step may be cerium oxide or colloidal silica. The average particle size of the abrasive grains is 1 μm or less (for example, 10 nm to 1 μm).

The electronic device substrate referred to throughout the present specification is an angled (for example, a quadrilateral (square or rectangular)) substrate and includes a mask blank substrate or the like. Unlike a circular semiconductor wafer, the electronic device substrate mentioned in this invention has an angled shape. Generally, in case where a plurality of substrates of an angled shape are simultaneously polished by a batch-type double-sided polishing method on both of the first and the second principal surfaces, the profile in each surface may become asymmetrical and the individual substrates may be different in flatness from one another. This invention is effectively applicable to the electronic device substrate of an angled shape which is difficult to control the flatness of the substrate in the double-sided polishing method.

(29) A method of producing an electronic device substrate as described in (28), wherein the double-sided polishing is a multistage polishing step including a rough polishing step of polishing the substrate by the use of relatively large abrasive grains in order to maintain the flatness obtained in a lapping step and to remove a flaw formed in the substrate during the lapping step, and a precision polishing step of polishing the substrate by the use of relatively small abrasive grains in order to process the substrate into a mirror surface.

In the event that the double-sided polishing is a multistage polishing step including a rough polishing step of polishing the substrate by the use of relatively large abrasive grains in order to maintain the flatness obtained in a lapping step and to remove a flaw formed in the substrate during the lapping step, and a precision polishing step of polishing the substrate by the use of relatively small abrasive grains in order to process the substrate into a mirror surface, it is possible to produce a high-smoothness and high-flatness substrate required for an electronic device substrate with high efficiency (with high productivity).

(30) A method of producing an electronic device substrate as described in (28) or (29), wherein the double-sided polishing provides the substrate having a surface roughness Ra of 0.25 nm or less and a flatness of 1 μm or less, where Ra is representative of a center-line mean roughness defined in Japanese Industrial Standard JIS B0601.

In the event that the substrate prior to modification of the profile is processed to have a surface roughness Ra of 0.25 nm or less and a flatness of 1 μm or less, it is possible to reduce a load upon modification of the profile and, as a consequence, to improve the productivity. In the etching (in particular, dry etching) of corroding and removing the substrate as the means for modifying the profile, the surface roughness of the substrate tends to be roughened during the modification of the profile. Therefore, by reducing the load upon modification of the profile, it is possible to maintain the surface roughness of the substrate before modification of the profile or to suppress roughening of the surface roughness during modification of the profile.

(31) A method of producing an electronic device substrate as described in any one of (28) through (30), wherein the local modification of the profile is carried out by single-sided polishing the principal surface of the substrate and pressing the substrate against the polishing pad with a greater pressure in the convex area than in the remaining area to thereby modify the flatness of the substrate.

Thus, by single-sided polishing the principal surface of the substrate and pressing the substrate against the polishing pad with a greater pressure in the convex area than in the remaining area, the profile is locally modified. In this manner, the smoothness of the substrate surface produced by the double-sided polishing method is maintained or improved so that the flatness is improved.

For example, the single-sided polishing method is illustrated in FIG. 9.

A surface table with a polishing pad adhered thereto is driven in rotation by a rotation unit (not shown). On the surface table, a substrate is held by a profile adjusting pressing plate rotatably supported. Abrasive grains are supplied between the substrate and the polishing pad and the substrate is moved in frictional contact with the polishing pad so that the substrate is single-sided polished. The profile adjusting pressing plate comprises a retainer ring surrounding the substrate, and a plurality of pressing members connected to a cylinder controlled in pressure by a regulator (not shown) so that a plurality of divided regions are individually pressed under a desired pressure from a rear surface opposite to the principal surface subjected to local profile modification. By controlling the pressing members to press the substrate so that the pressure of the polishing pad applied to the substrate is greater in the convex area than in the remaining area, the profile is modified. In FIG. 9, vectors (arrows) of the pressing members represent the magnitudes of the pressing force.

The average particle size of the abrasive grains used in profile modification is preferably equal to or smaller than the average particle size of the abrasive grains used in the final double-sided polishing step. If the former is greater than the latter, the flatness is improved but the smoothness (surface roughness) is roughened. Preferably, use is made of colloidal silica having a small average particle size.

For the polishing pad used in profile modification, a material and a hardness which improve the flatness of the substrate are appropriately selected. Preferably, use may be made of a suede-like polyurethane pad of a soft or an ultra-soft polisher.

(32) A method of producing an electronic device substrate as described in any one of (28) through (31), wherein the local profile modification utilizes an etching action.

As a mode utilizing the etching action, there are cases where the etching action alone is utilized and where the etching action is applied to (13).

In the former, the wet etching and the dry etching can be used.

In case of the wet etching, precise modification of the profile is carried out by masking an area except the relatively convex area with an etch-resistant material before the etching is carried out. In this manner, the relatively convex area is locally modified in profile.

In case of the dry etching, the profile is modified while an etching gas is supplied to the convex area. As compared with the wet etching using the masking, the profile can be modified simply and more accurately.

In the latter case, by including a solvent providing the etching action to the substrate into the slurry containing the abrasive grains, the polishing rate can be adjusted.

(33) A method of producing an electronic device substrate as described in any one of (28) through (32), wherein the substrate is a glass substrate for a mask blank.

The mask blank in this invention includes a transmissive mask blank and a reflective mask blank. The mask blank comprises a substrate and a transfer pattern thin film formed thereon. The transfer pattern thin film is patterned into a transfer pattern to be transferred to an object.

For example, the transmissive mask blank is a photomask blank comprising, as a substrate, a glass substrate which is a translucent substrate and, as a transfer pattern thin film, a thin film for causing an optical change in exposure light used in transfer to the object (for example, a thin film having a light shielding function).

Herein, the term "mask blank" is used in a broad sense and includes a photomask blank provided with only an opaque film having a function of shielding the exposure light and a phase shift mask blank provided with a phase shift film having a phase shift function of causing a change in phase difference in the exposure light. The "mask blank" in this invention also includes a phase shift mask blank provided with a halftone film which is a semi-transmissive film having a function of shielding the exposure light and a phase shift function of causing a change in phase difference.

For example, the reflective mask blank comprises, as a substrate, a low-expansion glass substrate and, as a transfer pattern thin film, a reflective multilayer film formed on the substrate and an absorber film to serve as a transfer pattern.

In addition to the opaque film and/or the phase shift film as the transfer pattern thin film, the mask blank in this invention may include a resist film to serve as a mask when the opaque film or the phase shift film is patterned, and any other appropriate film (for example, a transparent conductive film).

The material of the glass substrate is not specifically limited. As the glass substrate for use in the mask blank, use is made of a glass adapted to transmit the exposure light, for example, a synthetic quartz glass, an alkali-free glass, a borosilicate glass, an aluminosilicate glass, and a soda lime glass.

(34) A method of producing a mask blank, comprising the step of forming at least a transfer pattern thin film on a principal surface of an electronic device substrate obtained by the method described in any one of (28) through (33).

(35) A method of producing a transfer mask, comprising the step of forming a transfer pattern by patterning a transfer pattern thin film of a mask blank obtained by the method described in any one of (28) through (34).

(36) A fine pattern forming method of forming a fine pattern on an objective substrate by using a photolithography technique, wherein the fine pattern is transferred onto the objective substrate by the use of the transfer mask produced by the method described in (7).

(37) A fine pattern forming method of forming a fine pattern on an objective substrate by using a photolithography technique, wherein the fine pattern is transferred onto the objective substrate by the use of the transfer mask produced by the method described in (27).

(38) A fine pattern forming method of forming a fine pattern on an objective substrate by using a photolithography technique, wherein the fine pattern is transferred onto the objective substrate by the use of the transfer mask produced by the method described in (35).

BRIEF DESCRIPTION OF THE DRAWING

FIGS. 1A, 1B, and 1C are views for describing a method of determining a flatness of an electronic device substrate according to this invention;

DESCRIPTION OF THE PREFERRED EMBODIMENTS

Figure 2:
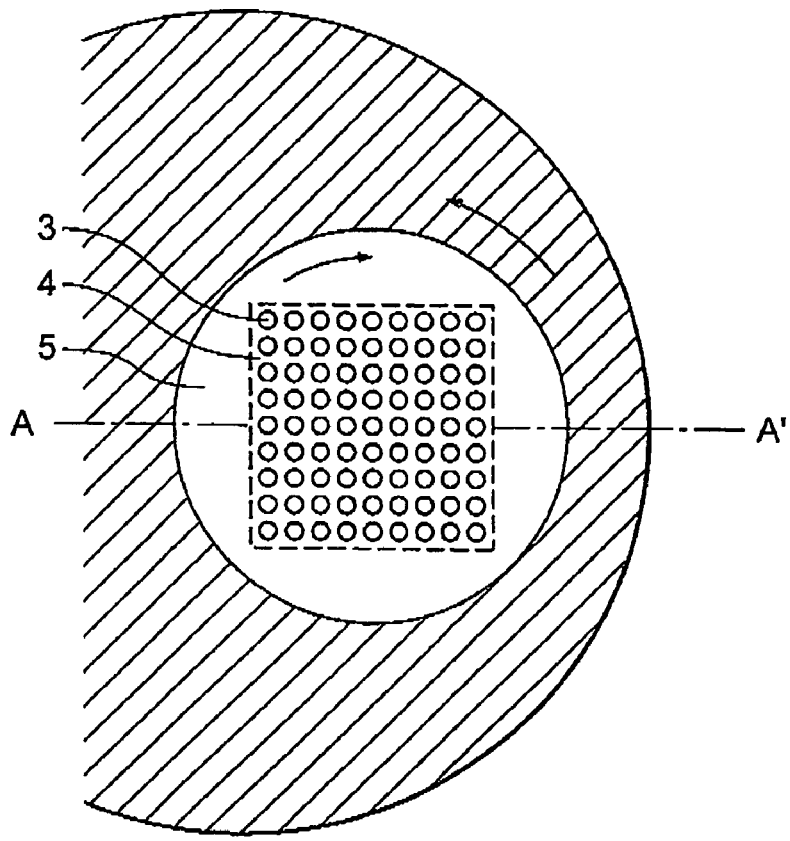
FIG. 2 is a plan view of a polishing apparatus used in a method of adjusting a flatness of an electronic device substrate according to this invention.

Now, description will be made in detail about a method of determining a flatness of an electronic device substrate according to an embodiment of this invention.

In order to produce a photomask blank in which a light shielding thin film having a light shielding function is formed as a thin film and a phase shift mask blank in which a halftone film having a phase shift function and a light shielding function is formed as a thin film, the flatness of a transparent substrate is determined as follows.

At first, preparation was made of a transparent substrate (silica glass substrate) equal in size (6 inch×6 inch×0.25 inch) (1 inch=25.4 mm) and material to the photomask blank and having a known flatness (0.5 μm (convex): measured by a flatness measuring equipment (FM200 manufactured by Tropel)). On a principal surface of the transparent substrate, a chromium nitride film, a chromium carbide film, and a chromium oxide nitride film were deposited as an opaque film by sputtering to a total thickness of 900 angstroms to obtain a photomask blank. On the other hand, on the principal surface of the transparent substrate, a nitrogenated molybdenum silicide film was deposited as a halftone film by sputtering to a thickness of 800 angstroms to obtain a phase shift mask blank. It is noted here that depositing conditions for the light shielding thin film and the halftone film were same as those in production of the photomask blank and the phase shift mask blank.

For each of the photomask blank and the phase shift mask blank, the flatness was measured. As a result, the photomask blank had a flatness of 0.2 μm (convex) while the phase shift mask blank had a flatness of 1.6 μm (convex).

From the flatness of the transparent substrate, the flatness of the photomask blank, and the flatness of the phase shift mask blank, calculation was made of the variation in flatness of the light shielding thin film and the variation in flatness of the halftone film. As a result, the variation in flatness was equal to −0.3 μm for the opaque film and +1.1 μm for the halftone film.

Therefore, in order to achieve an ideal flatness (0 μm) in each of the photomask blank and the phase shift mask blank, the flatness of the transparent substrate for producing the photomask blank was determined to be equal to 0.3 μm (convex) and the flatness of the transparent substrate for producing the phase shift mask blank was determined to be equal to 1.1 μm (concave).

Next, description will be made in detail about the method of determining a flatness of an electronic device substrate according to a second embodiment of this invention.

In order to produce a phase shift mask in which a halftone film having a phase shift function and a light shielding function is formed as a thin film, the flatness of a transparent substrate is determined in the following manner.

At first, preparation was made of a transparent substrate (silica glass substrate) equal in size (6 inch×6 inch×0.25 inch) and material to the phase shift mask blank and having a known flatness (1.0 μm (convex): measured by the flatness measuring equipment (FM200 manufactured by Tropel)). On a principal surface of the transparent substrate, a molybdenum silicide nitride film was deposited as a halftone film by sputtering to a thickness of 800 angstroms and a resist film was formed by spin coating to a thickness of 400 angstroms. Through a mask having a desired pattern, exposure and development were carried out. Thus, the phase shift mask blank having a desired pattern was produced (pattern occupancy (aperture): about 20%).

The flatness of the phase shift mask was measured. As a result, the flatness of the phase shift mask was equal to 2.0 μm (convex).

Therefore, in order to achieve an ideal flatness (0 μm) of the phase shift mask, the flatness of the transparent substrate for producing the phase shift mask was determined to be equal to 2.0 μm (concave).

In the foregoing, the pattern occupancy (aperture) alone was considered to determine the flatness of the transparent substrate. However, even with the same pattern occupancy (aperture), the stress variation will be caused to occur depending upon the position and the shape of the thin film pattern with respect to the flatness of the mask blank as a reference. Therefore, in case where the flatness must be controlled with higher accuracy, it is preferable to determine the flatness of the transparent substrate with reference to the position and the shape of the thin film pattern, in addition to the pattern occupancy (aperture).

EXAMPLE 1

Now, description will be made of a method of producing a photomask blank and a method of producing a photomask.

By a method of adjusting a flatness of a transparent substrate, which will later be described, the flatness of a transparent substrate (silica glass substrate) was adjusted to 0.3 μm (convex). On a principal surface of the transparent substrate, a chromium nitride film, a chromium carbide film, and a chromium oxide nitride film were deposited as a light shielding thin film by sputtering to a thickness of 900 angstroms under the above-mentioned depositing condition. Thus, a photomask blank was produced.

The flatness of the photomask blank thus obtained was measured in the manner similar to that mentioned above. As a result, the photomask blank had a high flatness of 0.1 μm (convex). The ideal flatness of 0 μm was not achieved presumably because of fluctuation in the production process and the measuring equipment. Furthermore, on the light shielding thin film, a resist film was formed by spin coating. Through a mask having a predetermined pattern, exposure and development were carried out. Thus, a photomask having a desired pattern was produced. The pattern position of the photomask thus obtained was compared with reference pattern data. As a result, the pattern position accuracy was excellent.

EXAMPLE 2

By controlling the polishing condition for double-sided precision polishing, the flatness of a transparent substrate (silica glass substrate) was adjusted to 1.1 μm (concave). On a principal surface of the transparent substrate, a nitrogenated molybdenum silicide film was deposited as a halftone film by sputtering to a thickness of 800 angstroms under the above-mentioned depositing condition. Thus, a phase shift mask blank was produced.

The flatness of the phase shift mask blank thus obtained was measured in the manner similar to that mentioned above. As a result, the phase shift mask blank had a high flatness of 0.2 μm (concave). The ideal flatness of 0 μm was not achieved presumably because of fluctuation in the measuring equipment. Furthermore, on the halftone film, a resist film was formed by spin coating. Through a mask having a predetermined pattern, exposure and development were carried out. Thus, a phase shift mask having a desired pattern was produced. The pattern position of the phase shift mask thus obtained was compared with reference pattern data. As a result, the pattern position accuracy was excellent.

EXAMPLE 3

By controlling the polishing condition for double-sided precision polishing, the flatness of a transparent substrate (silica glass substrate) was adjusted to 2.0 μm (concave). On a principal surface of the transparent substrate, a nitrogenated molybdenum silicide film was deposited as a halftone film by sputtering to a thickness of 800 angstroms under the above-mentioned depositing condition. Furthermore, on the halftone film, a resist film was formed by spin coating to a thickness of 4000 angstroms. Through a mask having a predetermined pattern, exposure and development were carried out. Thus, a phase shift mask having a desired pattern was produced.

The flatness of the phase shift mask thus obtained was measured in the manner similar to that mentioned above. As a result, the phase shift mask had a high flatness of 0.1 μm (convex). The ideal flatness of 0 μm was not achieved presumably because of fluctuation in the measuring equipment.

COMPARATIVE EXAMPLE

Without resorting to the above-mentioned method of determining a flatness of a transparent substrate, a substrate having a high flatness (silica glass substrate having a flatness of 0.5 μm (convex)) was prepared by controlling the polishing condition of precision polishing as known in the art. In the manner similar to Examples 1, 2, and 3, a photomask blank, a photomask, a phase shift mask blank, and a phase shift mask were produced by the use of the substrate.

As a result, the flatness of the photomask blank was 1.5 μm (concave). The flatness of the phase shift mask blank was 1.6 μm (convex). Thus, the flatness of each of the photomask blank and the phase shift mask blank was deteriorated. Furthermore, in the manner similar to that mentioned above, a photomask and a phase shift mask were produced. Evaluation was made of the pattern position accuracy. As a result, the pattern position accuracy was deteriorated as compared with reference pattern data.

Next referring to FIGS. 2 through 5, description will be made of a method of adjusting the flatness of an electronic device substrate (method of producing an electronic device substrate) according to an embodiment of this invention.

Figure 3:
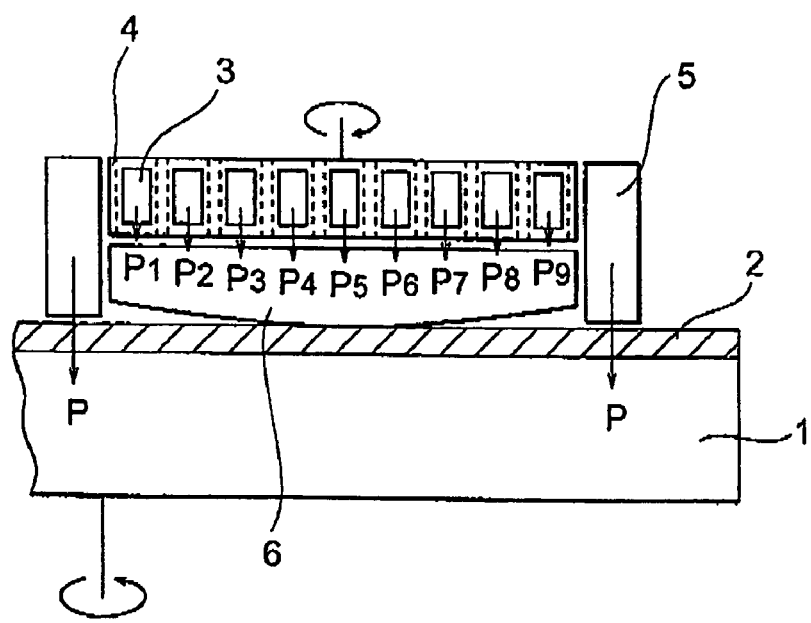
FIG. 3 is a sectional view taken along a line A-A' in FIG. 2.

Referring to FIGS. 2 and 3, a polishing apparatus comprises a surface table 1 having a polishing pad 2 attached thereto and rotated by a rotating unit (not shown) through a surface table rotary shaft, a plurality of pressing members for individually and desirably pressing a plurality of divided regions of the principal surface of a substrate, pressing member holding means 4 for holding the pressing members 3, pressure control means for controlling a pressure applied by each of the pressing members 3, and a retainer ring (substrate holding means) 5 for holding the substrate 6. The rotation of the surface table 1 and the pressure applied by each individual pressing member 3 upon the substrate 6 are controlled and the pressing member holding means 4 and the retainer ring 5 are integrally rotated. Thus, single-sided polishing of the principal surface of the substrate facing the polishing pad 2 is carried out.

By the use of the above-mentioned polishing apparatus, the flatness of the electronic device substrate is adjusted in the following manner.

The substrate 6 is held on the surface table 1 by the retainer ring 5 and is rotated while being pressed against the surface table 1 by the pressing members 3.

The retainer ring 5 presses the polishing pad 2 and serves to equalize or uniformize the pressure applied to a peripheral portion of the substrate 6.

The polishing pad 2 is attached to an upper surface of the surface table 1. The pressing members 3 press the substrate 6 against the polishing pad 2 and are rotated in a direction reverse to that of the surface table 1. Thus, the principal surface of the substrate 6 is polished.

The pressing members 3 are held by the pressing member holding means 4. A number of the pressing members 3 are formed to cover the upper surface of the substrate 6 and adapted to locally and desirably control the pressure applied to the substrate 6.

Preferably, the pressing members 3 are driven by an air cylinder. In this event, an operating range (stroke) of the pressing members 3 can be widened and the pressing members 3 can easily be controlled by using a DA converter and a pneumatic/electric converter.

For example, it is assumed that the substrate 6 has a convex shape with a center portion large in thickness as illustrated in FIG. 3. In this case, the pressing members 3 located at the center portion of the substrate 6 are increased in pressure while the pressing members 3 located at the peripheral portion of the substrate 6 are decreased in pressure. Thus, the convex shape of the substrate can be flattened.

EXAMPLE 4

Figure 4:
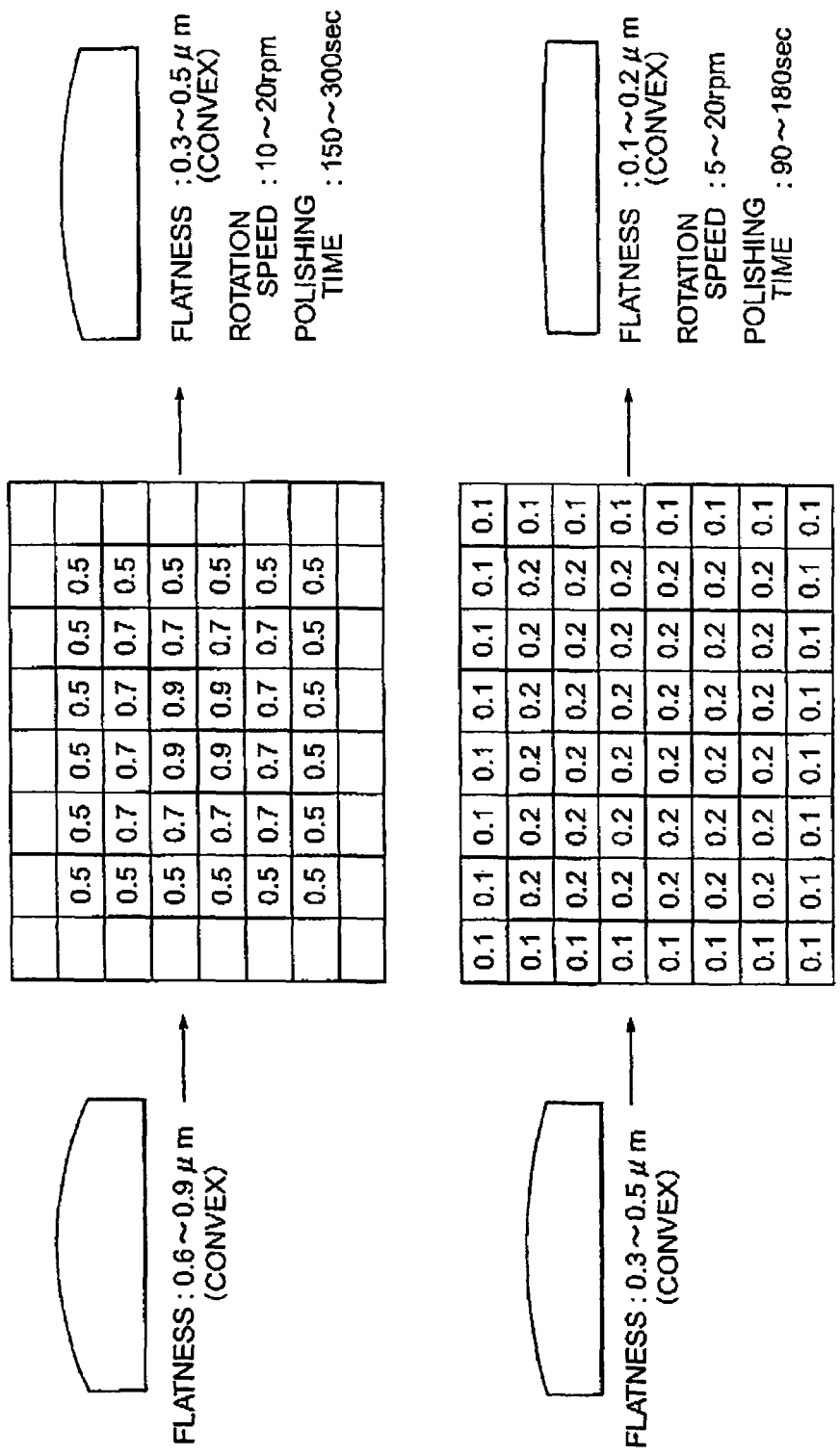
FIG. 4 is a view for describing the method of adjusting a flatness of an electronic device substrate according to this invention in case where the substrate has a convex shape.

Referring to FIG. 4, the flatness of the electronic device substrate of a convex shape was adjusted according to this invention in the following manner.

The flatness of the electronic device substrate was measured. As a result, the substrate surface had a profile like a dome. The flatness was on the order between 0.6 and 0.7 µm (convex). Therefore, the load type (1) in which the pressure is high at the center portion of the substrate was at first selected. More in detail, no load was applied upon the pressing members 3 disposed at the peripheral portion of the substrate while the load applied upon the substrate 6 was gradually reduced from the center portion of the substrate towards the peripheral portion of the substrate. In FIG. 4, numerical values shown in the load types (1) and (2) represent the pressure (kg/cm$^2$) exerted upon the substrate. The substrate was polished at the rotation speed of 10-20 rpm for a polishing time of 150-300 seconds. Use was made of a polishing solution containing colloidal silica (average particle size of 100 nm) as an abrasive suspended in water. As a result, the substrate having a flatness of 0.3-0.5 µm (convex) was obtained.

Furthermore, the load type (2) in which the center portion of the substrate is applied with a slightly higher pressure was selected. More in detail, the pressing members 3 disposed at the peripheral portion of the substrate were applied with a very small load (0.1 kg/cm$^2$) while the remaining pressing members 3 disposed at the center portion of the substrate were applied with a load (0.2 kg/cm$^2$) slightly greater than that applied to the pressing members 3 at the outer periphery of the substrate. The substrate was polished at the rotation speed of 5-20 rpm for a polishing time of 90-180 seconds. Use was made of a polishing solution containing colloidal silica (average particle size of 100 nm) as an abrasive suspended in water. As a result, the substrate having a flatness of 0.1-0.2 µm (convex) was obtained.

In this embodiment, a combination of the two load types was used. Advantageously, a number of load types are preliminarily prepared and an optimum combination is selected therefrom. Thus, a desired flatness can be realized more easily. In the foregoing, the flatness is adjusted by combining a plurality of stages of load types in synchronism with the progress of polishing. In this manner, a substrate having a desired flatness can efficiently be obtained.

Upon selection of the load type, use is preferably made of a software program supplied with various conditions of the polishing apparatus, such as the temperature, the rotation speed, the current value, and the torque value of the surface table to automatically select a combination of the load types optimum to obtain a desired flatness.

EXAMPLE 5

Figure 5:
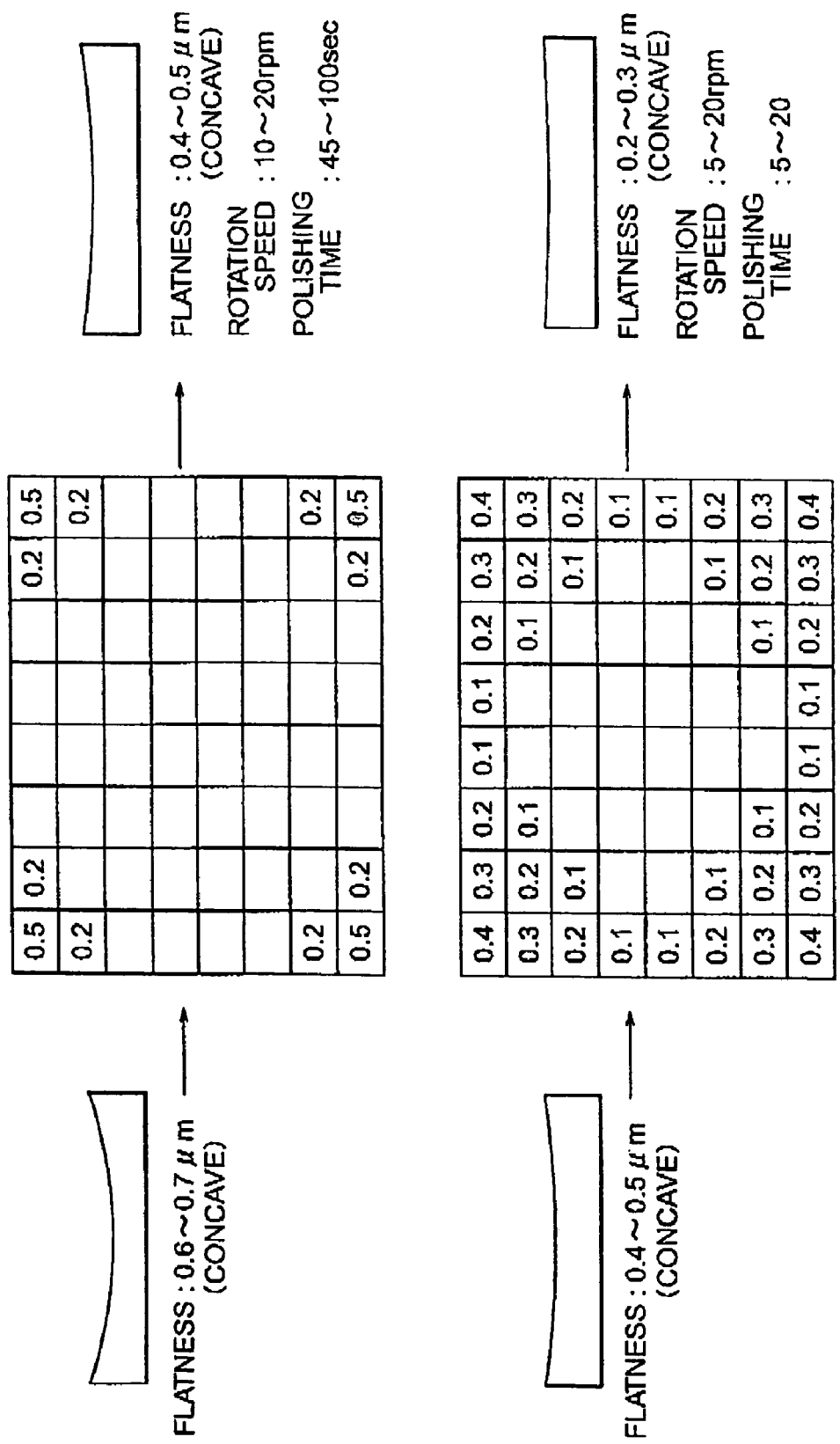
FIG. 5 is a view similar to FIG. 4 in case where the substrate has a concave shape.

Referring to FIG. 5, the flatness of the electronic device substrate of a concave shape was adjusted.

As a result of measurement of the electronic device substrate, the substrate surface had a profile like a bowl. The flatness was within a range between 0.6 and 0.7 µm (concave). Therefore, the load type (3) in which corner portions of the substrate are applied with higher pressure is at first selected. More in detail, no load was applied upon the pressing members 3 disposed at the center portion of the substrate while the pressing members 3 disposed at the corner portions of the substrate were applied with a highest load. In FIG. 5, numerical values shown in the load types (3) and (4) represent the pressure (kg/cm$^2$) exerted upon the substrate. The substrate was polished at the rotation speed of 10-20 rpm for a polishing time of 45-100 seconds. Use was made of a polishing solution containing colloidal silica (average particle size of 100 nm) as an abrasive suspended in water. As a result, the substrate having a flatness of 0.4-0.5 µm (concave) was obtained.

Furthermore, the load type (4) in which the corner portions of the substrate are applied with a slightly higher pressure was selected. More in detail, the pressing members 3 disposed at the center portion of the substrate were applied with no load while the pressing members 3 disposed at the peripheral portion of the substrate were applied with a load which is gradually decreased inward from the corner portions of the substrate. The substrate was polished at the rotation speed of 5-20 rpm for a polishing time of 5-20 seconds. Use was made of a polishing solution containing colloidal silica (average particle size of 100 nm) as an abrasive suspended in water. As a result, the substrate having a flatness of 0.2-0.3 µm (concave) was obtained.

COMPARATIVE EXAMPLE

The electronic device substrates used in Examples 3 and 4 were polished with a uniform load applied upon the surface of the substrate. As a result, the flatness was not excellent.

EXAMPLE 6

The flatness was adjusted in the manner similar to Example 3 except that the polishing solution in Example 3 was replaced by a polishing solution containing colloidal silica (average particle size of 100 nm) as an abrasive and sodium hydroxide added thereto so as to achieve a pH value of 11.2 and that mechanochemical polishing was used.

As a result, the substrate finally obtained had a substantially equivalent flatness. However, the polishing time required in adjustment of the flatness can be shortened by about 15-20%.

According to this invention, even in case where the thin film itself has a film stress, the photomask blank having a desired flatness can be obtained. It is therefore possible to provide a method of producing a photomask blank and a method of producing a photomask, which are capable of achieving a desired flatness of the photomask blank and which are capable of avoiding deterioration in pattern position accuracy of the photomask as well as occurrence of a pattern displacement error and a pattern defect during pattern transfer.

It is also possible to provide a method of determining a flatness of an electronic device substrate to be used in a photomask blank and a photomask excellent in flatness as well as a method of adjusting a flatness.

Polishing Apparatus and Polishing Method

Herein, a "substrate" means an object (an object to be polished, a substrate) to be subjected to profile adjustment or modification and surface defect removal by a polishing apparatus according to this invention.

Figure 6:
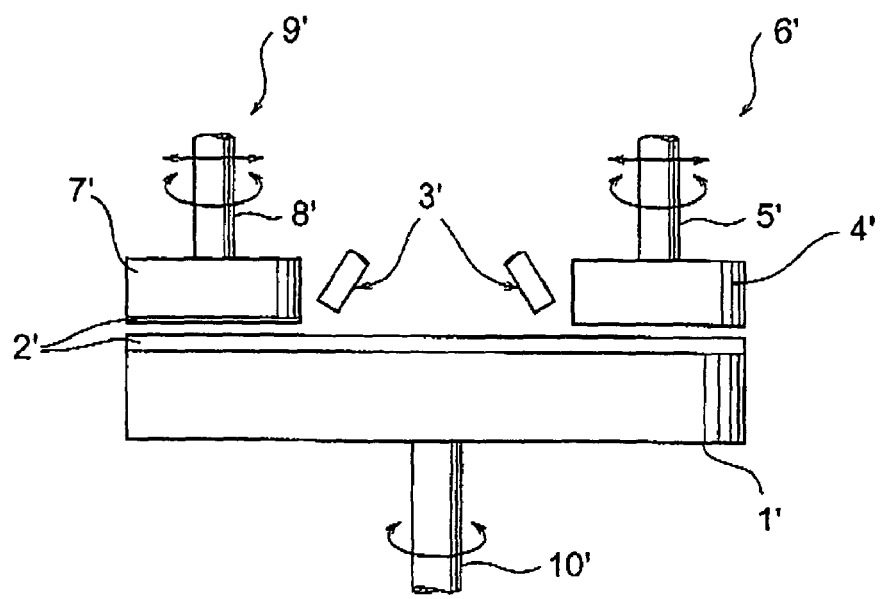
FIG. 6 is a schematic view of a polishing apparatus according to this invention.

Referring to FIG. 6, a polishing apparatus according to this invention comprises a surface table 1' provided with a polishing pad 2' adhered thereto and driven in rotation by a rotation unit (not shown) through a surface table rotation shaft 10', a substrate profile adjusting section 6', and a substrate defect removing section 9'. The substrate profile adjusting section 6' comprises a profile adjusting pressing plate (substrate pressing means) 4' having a plurality of pressing members 23' for individually and desirably pressing a plurality of divided regions of a principal surface of a substrate, pressure control means 26' for controlling a pressure applied by each of the pressing members 23', and a retainer ring (substrate holding means) 22' for holding the substrate. The rotation of the surface table 1' and the pressure applied by each individual pressing member 23' upon the substrate are controlled and the profile adjusting pressing plate 4' and the retainer ring 22' are integrally rotated. Thus, the substrate profile adjusting section 6' carries out single-sided polishing of the principal surface of the substrate facing the polishing pad 2'. The substrate defect removing section 9' comprises a defect removing pressing plate 7' with a polishing pad adhered thereto, and a carrier 31' for holding the substrate. By the rotation of the surface table 1' and the rotation of the carrier 31', both of opposite principal surfaces of the substrate are polished to remove an abrasive attached to the substrate and a microscopic flaw.

The surface table 1', the profile adjusting pressing plate 4', the retainer ring 22', the defect removing pressing plate 7', and the carrier 31' are driven in rotation by independent rotation units (not shown) through respective rotation shafts. The rotation shafts and the surface table rotation shaft are reversibly rotatable independent of one another. The profile adjusting pressing plate 4' and the defect removing pressing plate 7' can be wobbled in a horizontal direction. With the above-mentioned structure, a polishing condition can flexibly be determined.

Each of the substrate profile adjusting section 6' and the substrate surface defect removing section 9' is provided with abrasive (slurry) supplying means 3' so as to supply an abrasive solution (slurry) to the substrate. Alternatively, the abrasive supplying means 3', one in number, may be used to supply the abrasive solution in the substrate profile adjusting section 6' and the substrate surface defect removing section 9' in common.

The polishing apparatus in this invention may have a structure in which the substrate profile adjusting section 6' and the substrate surface defect removing section 9' are provided with separate surface tables. Alternatively, a plurality of substrate profile adjusting sections 6' and a plurality of substrate surface defect removing sections 9' may be provided for a single surface table.

Next referring to FIGS. 7 and 8, description will be made in detail of the substrate profile adjusting section 6' and the substrate surface defect removing section 9' as well as the polishing method using the same.

Figure 7:
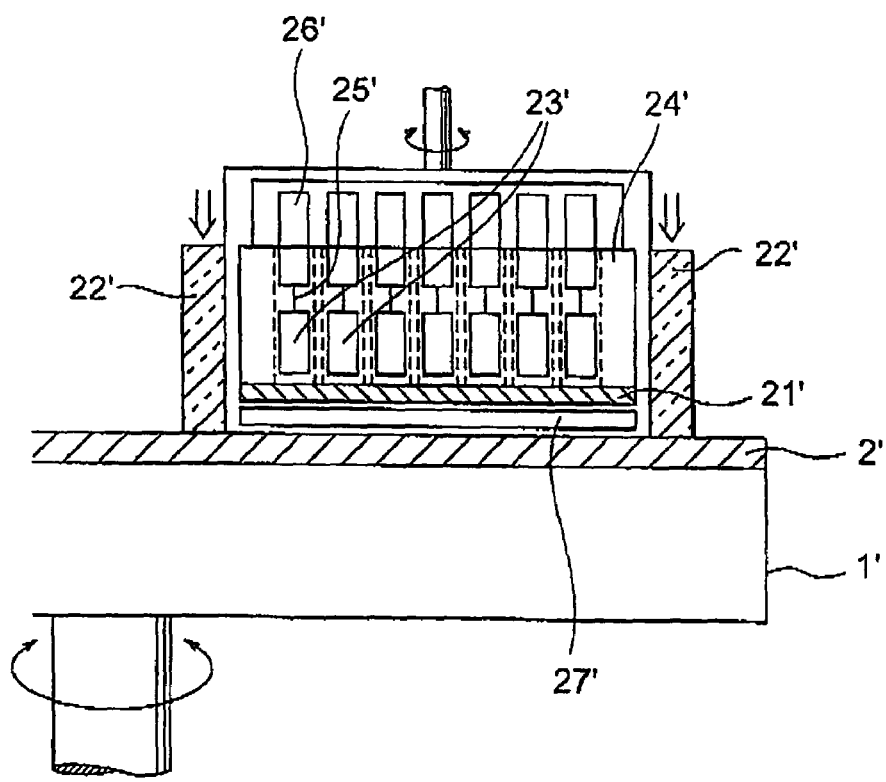
FIG. 7 is a schematic view of a substrate profile adjusting section of the polishing apparatus illustrated in FIG. 6.

Referring to FIG. 7, the profile adjusting pressing plate (substrate pressing means) 4' comprises a plurality of the pressing members 23' uniformly distributed at equal intervals with respect to the principal surface of the substrate, and pressing member holding means 24' holding the pressing members 23'. In order that the pressing members 23' are uniformly distributed with respect to the principal surface of the substrate, the pressing member holding means 24' is provided with a plurality of cylindrical holes (6×6 in case where the substrate is an electronic device substrate (mask blank substrate)). In each hole, the pressing member 23' for locally pressing the substrate is connected through a connecting member 25' to a single-action cylinder as the pressure control means 26' capable of controlling the pressure in a plurality of stages. By feeding compressed air to the cylinder, the pressing members 23' are operated. Therefore, a sufficient stroke can be assured and control is easy by the use of a DA converter and an electric/pneumatic converter.

On surfaces of the pressing members 23' and the pressing member holding means 24' facing the surface table, a packing pad 21' is interposed between the pressing members 23' and the pressing member holding means 24' and the substrate so as to prevent the substrate from being damaged by the pressing members 23'.

Figure 10:
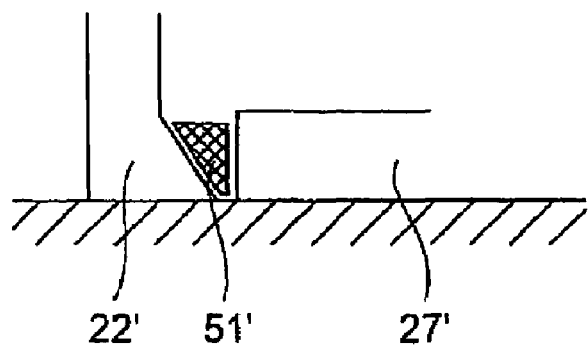
FIG. 10 is a view showing a retainer ring.

The retainer ring 22' as the substrate holding means is arranged along an outer periphery of the substrate and pressed by one or a plurality of cylinders controlled in pressure by an electronic regulator. As illustrated in FIG. 10, the retainer ring 22' on the side of the surface table 1' may be provided with an elastic member 51' formed on an inner peripheral portion to be brought into contact with a substrate 27' in order to prevent a substrate end (side surface, chamfered face) from being chipped off or damaged. The elastic member 51' may be formed throughout an entire area along the outer periphery of the substrate or may be formed partially.

The substrate 27' held by the retainer ring 22' is rotated around its own axis following the rotation of the pressing member holding means 24' with the individual pressing members 23' controlled in pressure so that the profile of the substrate 27' becomes a desired profile. By the rotation of the surface table 1', the polishing pad 2' adhered to the surface table 1' performs relative frictional movement with respect to the principal surface of the substrate facing the surface table. As a consequence, the substrate is single-sided polished so that the area where the profile is relatively convex with respect to any reference plane determined on the principal surface of the substrate facing the surface table is removed in preference to the remaining area. Thus, the profile is adjusted.

The retainer ring 22' and the pressing member holding means 24' may be connected to wobbling means to be wobbled.

Instead of the packing pad 21', at least a part of the pressing member 23' to be brought into contact with the substrate 27' may be made of a material which does not damage the substrate surface.

The arrangement and the number of the pressing members 23' are not specifically restricted and may appropriately be modified depending upon the size and the shape of the substrate 27' and the profile accuracy of the substrate profile.

Figure 8:
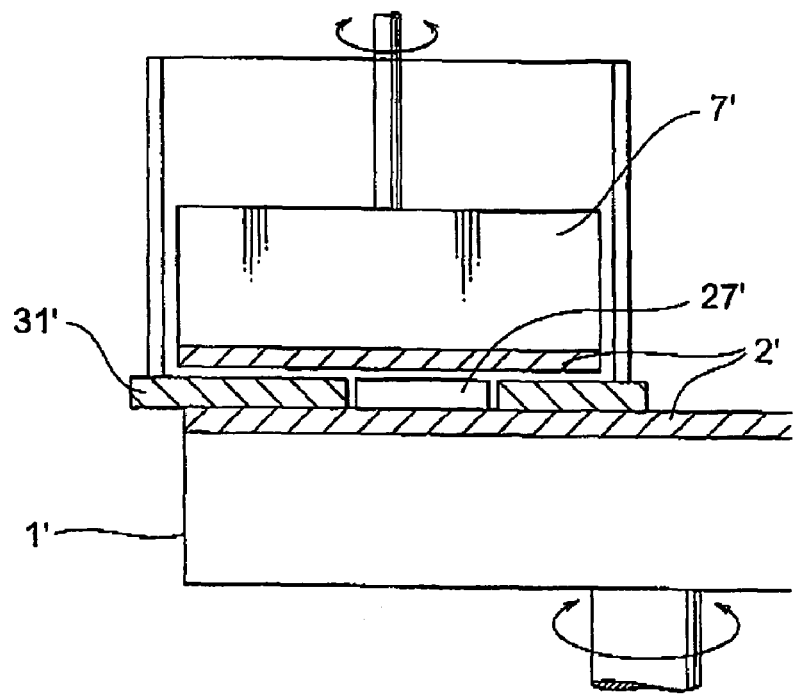
FIG. 8 is a schematic view of a substrate surface defect removing section of the polishing apparatus illustrated in FIG. 6.
Figure 9:
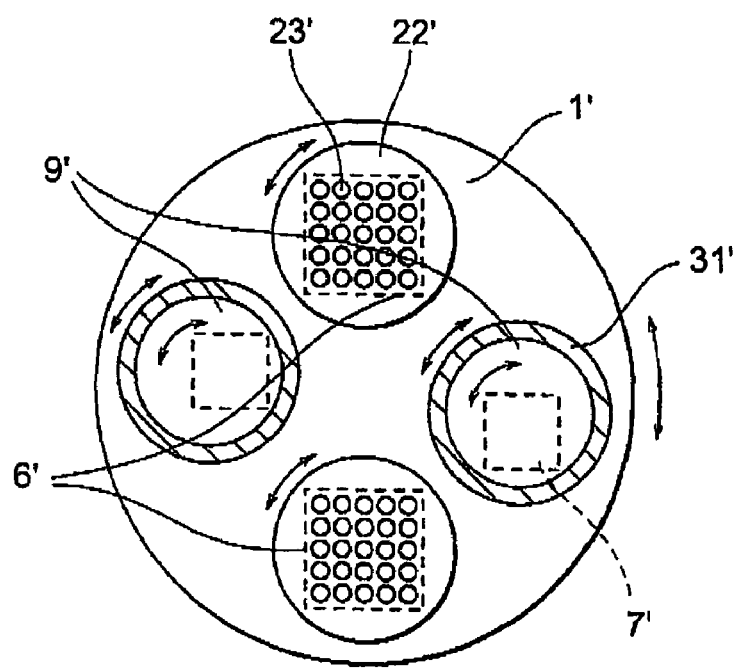
FIG. 9 is a schematic view of a preferred embodiment of the polishing apparatus.

Referring to FIG. 8, the substrate surface defect removing section 9' will be described.

The defect removing pressing plate 7' is driven in rotation by a rotation unit (not shown) through a rotation shaft and provided with the polishing pad 2' adhered thereto on the side of the surface table.

The carrier 31' has a substrate holding hole formed at an eccentric position.

The carrier 31' is driven in rotation by a rotation unit (not shown) around a rotation shaft independent of the defect removing pressing plate 7'.

The substrate 27' held by the substrate holding hole is rotated around its own axis following the rotation of the carrier 31'. In addition, by the rotation of the surface table and the pressing plate, the polishing pad 2' adhered to the surface table and the polishing pad 2' adhered to the defect removing pressing plate 7' perform relative frictional movement with respect to both of the opposite principal surfaces of the substrate. As a consequence, the principal surface of the substrate facing the surface table is polished by the surface table on the side of the defect removing pressing plate 7 while the defect or the foreign matter on the surface opposite to the surface modified in substrate profile (flatness) by the polishing apparatus in (17) is polished on the side of the surface table. Thus, the surface modified in substrate profile (flatness) by the polishing apparatus in (17) is maintained and the defect such as a flaw or a foreign matter can be removed.

The carrier 31' must have a mechanical durability against the rotation and preferably made of a material such as a stainless alloy, vinyl chloride, and a plastic material. The thickness is preferably as large as possible within a range smaller than the thickness of the substrate. The carrier may have a plurality of substrate holding holes so that a plurality of substrates can be arranged.

The surface table 1' is provided with a temperature sensor disposed inside so that the surface temperature of the surface table is controlled to be kept constant. A similar temperature sensor may be attached to the defect removing pressing plate 7' of the substrate surface defect removing section 9'.

Production of Electronic Device Substrate

Now, description will be made of a method of producing an electronic device substrate according to this invention.

Figure 11:
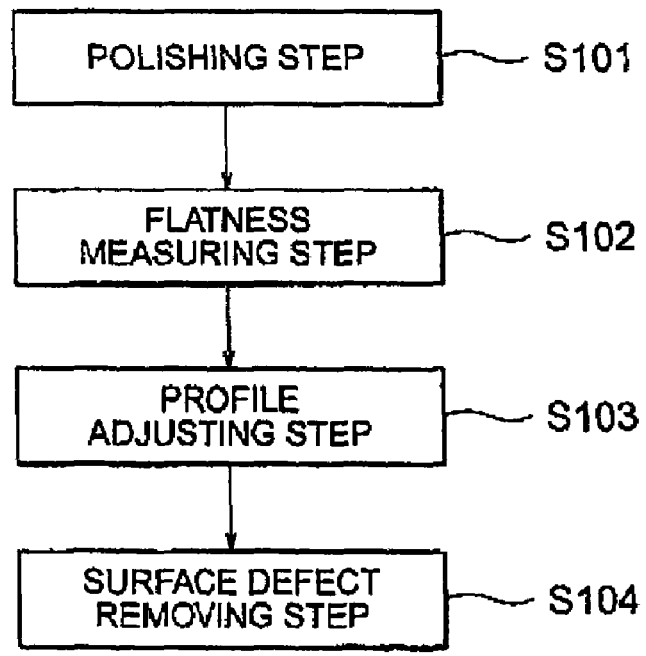
FIG. 11 is a flow chart for describing a production process of an electronic device substrate.

Referring to FIG. 11, the method comprises the following steps:

(S101) a polishing step of polishing, by a double-sided polishing method using relatively large abrasive grains, both of opposite principal surfaces of an electronic device substrate after chamfering of a side surface of the substrate and after lapping of both of the opposite principal surfaces of the substrate by a lapping table or the like;

(S102) a flatness measuring step of measuring the flatness of one of the principal surfaces of the substrate obtained by the polishing step;

(S103) a profile adjusting step of adjusting (modifying) the flatness of the substrate by locally adjusting the profile of the measured surface with reference to the measured data so that the flatness of the substrate coincides with a desired value; and (S104) a surface defect removing step of removing a defect present on the substrate surface after adjustment of the profile.

In order to prevent the abrasive grains used in a previous step from being brought into a next step, a cleaning step of removing the abrasive grains adhered to the substrate may be interposed between the polishing step and the profile adjusting step and between the profile adjusting step and the surface defect removing step.

In the polishing step (S101), single-sided polishing of polishing the principal surfaces of the substrate one by one may be carried out for each of the first and the second principal surfaces of the substrate or double-sided polishing of polishing both of the principal surfaces of the substrate at one time may be carried out. In view of the productivity, the double-sided polishing is preferable. Typically, the double-sided polishing is performed by the use of a double-sided polishing apparatus illustrated in FIG. 16. The substrate 27' is inserted and held the holding hole of the carrier 31'. An outer gear of the carrier 31' is engaged with a sun gear 64' and an internal gear 63' of the double-sided polishing apparatus. The carrier 31' is rotated and revolved and abrasive grains are supplied. The polishing pads 2' adhered to upper and lower surface tables rotated reverse to each other perform relative frictional movement with respect to the substrate so that both of the principal surfaces of the substrate are double-sided polished.

Generally, the polishing step comprises a plurality of polishing steps including a rough polishing step intended to remove a flaw on a principal surface of the substrate formed in the lapping step and to maintain the flatness obtained in the lapping step, and a precision polishing step intended to process the principal surface of the substrate into a mirror surface.

In the flatness measuring step (S102), the flatness is measured by the above-mentioned flatness measuring method over the above-mentioned measurement region under an appropriately selected condition. The flatness data obtained by the measurement are memorized in a recording medium such as a computer. Comparing the measured data memorized and desired flatness data preliminarily stored, the difference of the flatness is calculated. The working condition is determined so that the flatness of the substrate coincides with the desired value by removing the difference.

The working condition can be determined in the following manner.

In order to facilitate understanding, description will be made about the case where the substrate in which one principal surface has a convex profile (flatness) is adjusted (modified) in profile. It is supposed that the rotating direction of the substrate and the rotating direction of the surface table are reverse or same.

Figure 12:
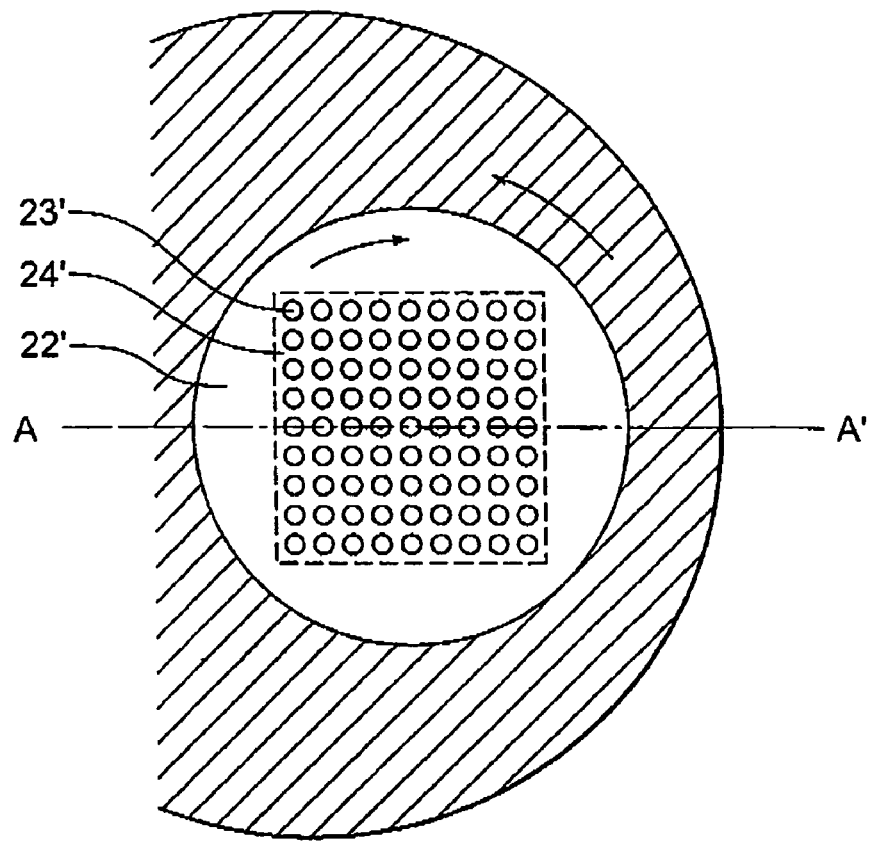
FIG. 12 is a top view of a substrate profile adjusting section of the polishing apparatus.
Figure 13:
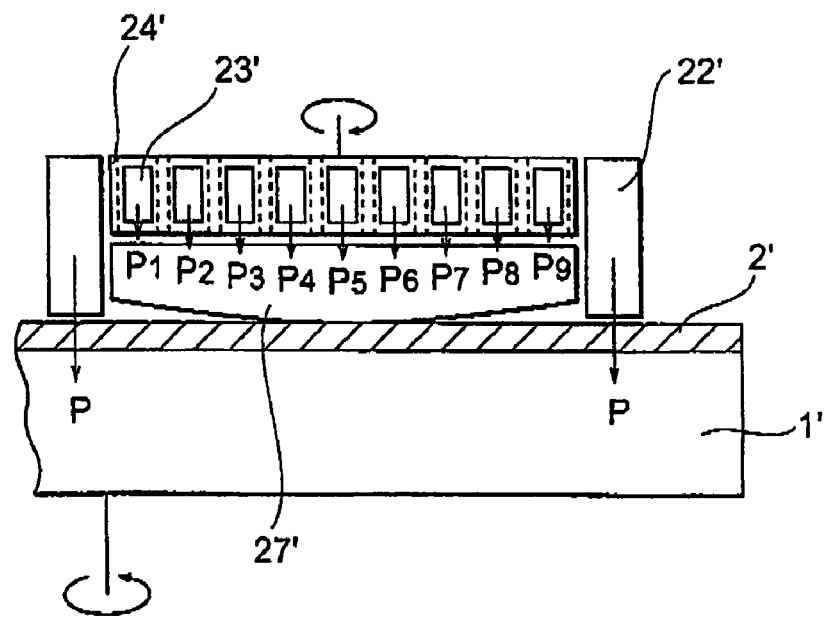
FIG. 13 is a sectional view taken along a line A-A' in FIG. 12.

Referring to FIGS. 12 and 13, the substrate profile adjusting section 6' is illustrated.

Upon determining the working condition for the substrate 27', the profile and the numerical values obtained by a flatness meter are converted into an area to determine the pressure and the rotation speed at a position to be removed.

At the time instant when a predetermined position to be removed is reached under the above-mentioned condition, the working condition is changed a new working condition is determined for another stage. Thus, the profile is adjusted.

The profile adjusting step (S103) is carried out by the substrate profile adjusting section 6' of the above-mentioned polishing apparatus in accordance with the working condition determined by the above-mentioned flatness measuring step.

The surface defect removing step (S104) is carried out by the substrate surface defect removing section 9' of the above-mentioned polishing apparatus.

The above-mentioned flatness measuring step may be carried out simultaneously with the profile adjusting step in the following manner. With the progress of the profile adjustment, the flatness of the substrate is measured. The flatness information obtained by measurement is fed back to the pressing condition of the individual pressing members.

The profile adjusting step (S103) and the surface defect removing step (S104) may be carried out in various manners. After the profile adjusting step (S103-1) is completed for one principal surface of the substrate, the profile adjusting step (S103-2) is carried out for the other principal surface. Thereafter, the surface defect removing step (S104) is carried out. Alternatively, after the profile adjusting step (S103-1) is completed for one principal surface of the substrate, the surface defect removing step (S104-1) is carried out. Then, after the profile adjusting step (S103-2) is completed for the other principal surface, the surface defect removing step (S104-2) is carried out. The substrate may be turned over in the middle of the surface defect removing step (S104).

Electronic Device Substrate

Figure 17:
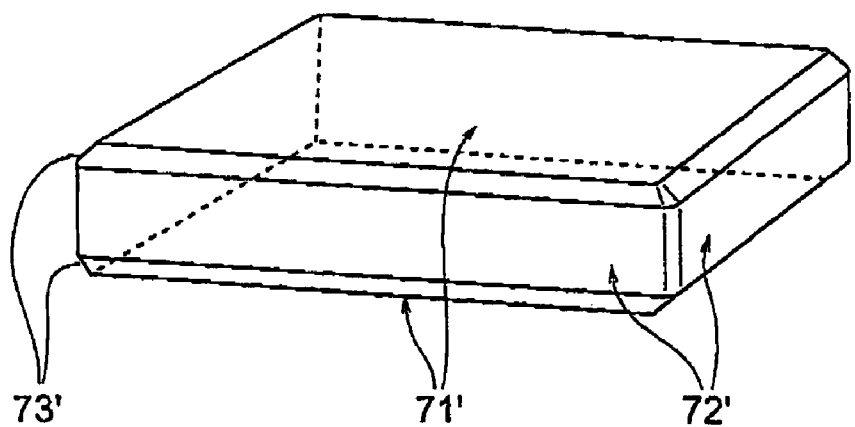
FIG. 17 is a view showing a substrate to be polished.

The electronic device substrate in this invention is obtained, for example, by the above-mentioned method of producing an electronic device substrate and has a high flatness and a high parallelism. Referring to FIG. 17, the electronic device substrate is an angled (rectangular) substrate having a pair of principal surfaces 71' opposite to each other, two pairs of side surfaces 72' perpendicular to the principal surfaces 71', and chamfered faces 73' interposed between the principal surfaces and the side surfaces. The principal surface (preferably, both of the opposite principal surfaces) has a high flatness greater than 0 μm and not greater than 0.25 μm. The flatness represents the flatness of an entire area of the principal surface(s) of the substrate except the side surfaces and the chamfered faces. Hereinafter, a value of the flatness indicate the flatness of the entire area of the principal surface(s) of the substrate.

The substrate has a high parallelism. The principal surface of the substrate has a parallelism greater than 0 μm and not greater than 1 μm.

Both of the opposite principal surfaces of the substrate are finished into mirror surfaces by precision polishing. The principal surfaces are finished to have a surface roughness of 0.3 nm or less in average surface roughness Ra, where Ra is representative of a center-line mean roughness defined in Japanese Industrial Standard JIS B0601. The surface roughness of the principal surface is preferably as small as possible in view of detection of a defect and uniformity of a film surface after deposition. Preferably, the principal surfaces are finished into mirror surfaces having Ra of 0.2 nm or less, more preferably 0.15 nm or less.

In order to prevent generation of particles, the side surfaces and the chamfered faces of the substrate are preferably finished into mirror surfaces by brush polishing or the like. The surface roughness is preferably 0.3 nm or less, more preferably 0.2 nm or less, further preferably 0.15 nm or less in average surface roughness Ra.

EXAMPLE 1

1) Rough Polishing Step (S101)

Preparation was made of synthetic quartz glass substrates (6 inch×6 inch) after subjected to chamfering at its end faces and lapping by a double-sided lapping apparatus. The glass substrates, 12 in number, were set in the above-mentioned double-sided polishing apparatus and subjected to a rough polishing step in the following polishing condition. A working load and a polishing time were appropriately adjusted.

Polishing Solution: cerium oxide (average particle size: 2-3 μm)+water
Polishing Pad: hard polisher (urethane pad)

After completion of the rough polishing step, the glass substrates were dipped in a cleaning tank (applied with an ultrasonic wave) to be cleaned in order to remove abrasive grains adhered to the glass substrates.

2) Precision Polishing Step (S101)

The glass substrates, 12 in number, were set in the above-mentioned double-sided polishing apparatus and subjected to a precision polishing step in the following polishing condition. A working load and a polishing time were appropriately adjusted.

Polishing Solution: cerium oxide (average particle size: 1 μm)+water
Polishing Pad: soft polisher (suede type)

After completion of the precision polishing step, the glass substrates were dipped in a cleaning tank (applied with an ultrasonic wave) to be cleaned in order to remove abrasive grains adhered to the glass substrates.

3) Ultrahigh Precision Polishing Step (S101)

The glass substrates, 12 in number, were set in the above-mentioned double-sided polishing apparatus and subjected to a ultrahigh precision polishing step in the following polishing condition. A working load and a polishing time were appropriately adjusted.

Polishing Solution: colloidal silica (average particle size: 100 nm)+water
Polishing Pad: ultrasoft polisher (suede type)

After completion of the ultrahigh precision polishing step, the glass substrates were dipped in a cleaning tank (applied with an ultrasonic wave) to be cleaned in order to remove abrasive grains adhered to the glass substrates.

4) Flatness Measuring Step (S102)

Among the 12 glass substrates thus obtained, one of the glass substrates was extracted. For the one glass substrate, the flatness of one principal surface was measured by a flatness measuring equipment (FM200 manufactured by Tropel). As a result, the substrate profile was concave and the flatness was 0.68 μm.

The surface roughness of the glass substrates was measured by an atomic force microscope (Nanoscope manufactured by Digital Instruments). Hereinafter, the surface roughness Ra was measured by the same equipment. As a result, the average surface roughness Ra was 0.18 nm.

For all of the 12 substrates and for both of the opposite principal surfaces, the measurement of the flatness was carried out in the similar manner. The measurement data were stored in a computer.

The glass substrates thus obtained had a thickness of about 0.25 inch (about 6.35 mm) and (Substrate Area)/(Substrate Thickness) was about $2.73 \times 10^{-4}$ $mm^{-1}$.

5) Profile Adjusting Step (S103)

Next, the measured data of the flatness stored in the computer were compared with a desired flatness of 0.25 μm. A difference in flatness was calculated by the computer. Taking into account the rotating directions and the rotating speeds of the substrate and the surface table, the working condition was determined. The profile modifying step was carried out by the substrate profile adjusting section 6 of the polishing apparatus in FIG. 6. The number of the pressing members 23 was equal to 36 (6×6) disposed at equal intervals with respect to the principal surface of the substrate.

Figure 19:
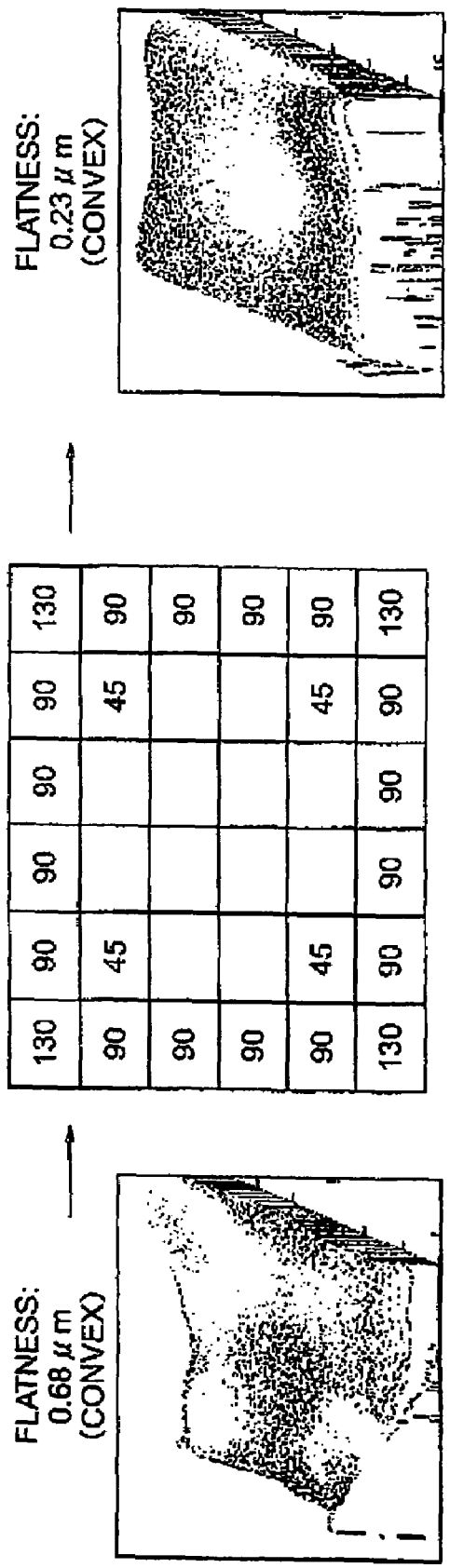
FIG. 19 is a view showing another polishing condition.

The specific polishing condition is shown in FIG. 19 and in the following. Since the substrate before adjusting the profile was concave, the pressure was higher in the corner portions and the peripheral portion of the substrate.

Pressure of Retainer Ring: 7.5 g/cm$^2$
Polishing Solution: colloidal silica (average particle size: 80 nm)+water
Polishing Pad: ultrasoft polisher (suede type)
Polishing Time: 20 minutes
Rotation Speed of Substrate: 6 rpm
Rotation Speed of Surface Table: 12 rpm After completion of the profile adjusting step, the glass substrates were dipped in a cleaning tank (applied with an ultrasonic wave) to be cleaned in order to remove abrasive grains adhered to the glass substrates.

For the glass substrates thus obtained, the flatness was measured by a measuring equipment similar to that mentioned above. As a result, the flatness was 0.23 μm (concave).

The surface roughness was measured also. As a result, the surface roughness Ra after the profile adjusting step was equal to 0.18 nm.

For the other principal surface not yet subjected to adjustment of the profile and the remaining 11 glass substrates, the above-mentioned profile adjusting step was carried out to produce the glass substrates.

As a result, all of the 12 glass substrates had a flatness within a range not greater than 0.25 μm in absolute value. Thus, the glass substrates having a high flatness were obtained.

For all of the 12 glass substrates, the parallelism was measured by a parallelism meter (ZYGO interferometer). As a result, the parallelism was 0.8 μm or less.

6) Surface Defect Removing Step (8104)

Next, in order to remove a flaw present on the surface of the substrate and a contact mark of contact with the pressing members in an area where the substrate is brought into contact with the pressing members in the profile adjusting step (S103), double-sided polishing was performed by the substrate surface defect removing section 9' of the polishing apparatus in FIG. 1. The specific polishing condition is as follows.

Polishing Solution: colloidal silica (average particle size 80 nm)+water
 Polishing Pad: ultrasoft polisher (suede type)
 Working Load: 30 g/cm$^2$
 Polishing Time: 10 minutes
 Rotation Speed of Substrate: 5 rpm After completion of the surface defect removing step, the glass substrates were dipped in a cleaning tank (applied with an ultrasonic wave) to be cleaned in order to remove abrasive grains adhered to the glass substrates.

The surface of the glass substrate was visually inspected. As a result, a flaw or a contact mark of contact with the pressing members in the profile adjusting step were not observed. Thus, the principal surface without a surface defect was obtained.

COMPARATIVE EXAMPLE 1

Glass substrates were prepared in the manner similar to Example 1 except that 4) Flatness Measuring Step, 5) Profile Adjusting Step, and 6) Surface Defect Removing Step were not carried out. For all of the 12 glass substrates after completion of 3) Ultrahigh Precision Polishing Step, the flatness was measured. As a result, the flatness was 0.5 μm to 1.5 μm (convex) and the parallelism was 1.2 μm to 3.4 μm.

EXAMPLE 2

Glass substrates were prepared in the manner similar to Example 1 except that the glass substrate had a size of 5 inch×5 inch (127 mm×127 mm) and the thickness of the glass substrate after completion of the ultrahigh precision polishing step was about 0.09 inch (about 2.23 mm) ((Substrate Area)/(Substrate Thickness): about $1.42 \times 10^{-4}$ mm$^{-1}$). As a result, all of the 12 glass substrates had a flatness within a range not greater than 0.25 μm in absolute value. Thus, the glass substrates having a high flatness were obtained. The surface of the glass substrate was visually inspected. As a result, a flaw or a contact mark of contact with the pressing members in the profile adjusting step were not observed. Thus, the principal surface without a surface defect was obtained.

Evaluation After Production of Photomask Blank and Photomask

On one principal surface of the glass substrate obtained in each of Examples 1 and 2 and Comparative Example, a chromium nitride film, a chromium carbide film, and chromium oxide nitride film were deposited by sputtering to a total thickness of 900 angstroms to produce a photomask blank. Similarly, on one principal surface of the glass substrate, a nitrogenated molybdenum silicide film was deposited by sputtering to a thickness of 800 angstroms to produce a phase shift mask blank.

Furthermore, a resist film was formed on the above-mentioned film by spin coating. Through a mask having a desired pattern, exposure and development were carried out. Thus, a photomask and a phase shift mask each of which has a desired pattern was produced.

The pattern position accuracy of each of the photomask and the phase shift mask was compared with the reference pattern data. As a result, the photomask and the phase shift mask obtained by the use of the glass substrate in each of Examples 1 and 2 had an excellent pattern position accuracy. On the other hand, the photomask and the phase shift mask obtained by the use of the glass substrate in Comparative Example had a pattern position accuracy fluctuating as compared with the reference pattern data and exhibited an unfavorable result.

Now, description will be made of a method of producing an electronic device substrate according to (17) through (24).

Figure 15:
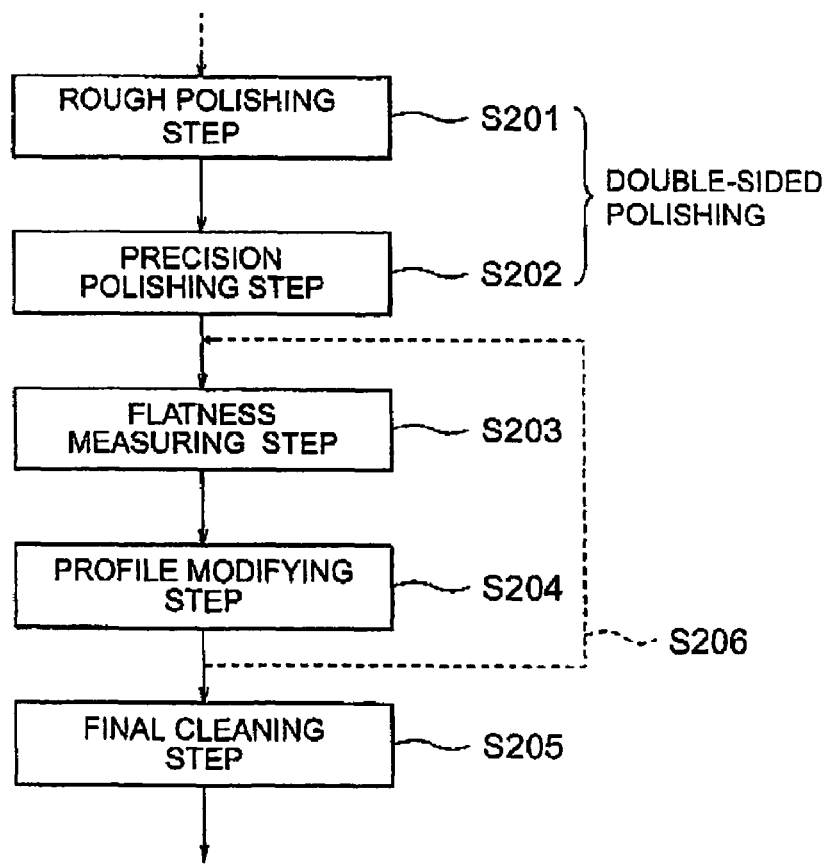
FIG. 15 is a flow chart for describing a production process of an electronic device substrate.

The method according to this invention generally has the following steps as shown in FIG. 15.

(S201) a rough polishing step of polishing, by a double-sided polishing method using a relatively large abrasive grain, both of principal surfaces of an electronic device substrate after chamfering of a side surface of the substrate and after lapping of both of the principal surfaces of the substrate by a lapping table or the like;

(S202) a precision polishing step of precision-polishing both of the principal surfaces of the substrate by a double-sided polishing method using a relatively small abrasive grain;

(S203) a flatness measuring step of measuring the flatness of one of the principal surfaces of the substrate obtained by the precision polishing step;

(S204) a profile modifying step of modifying the flatness of the substrate by locally modifying, with reference to the measured data, the profile of the measured surface for an area where the profile is relatively convex with respect to any reference plane so that the flatness of the substrate coincides with a desired value; and (S205) a final cleaning step of removing abrasive grains or a particle adhered to the substrate.

In case where the profile modifying step (S204) is carried out on both of the principal surfaces of the substrate or in case where the flatness is modified again, the flatness measuring step (S203), the profile modifying step (S204), and the final cleaning step (S205) are carried out again.

In order to prevent the abrasive grains used in a previous step from being brought into a next step, an ordinary cleaning step of removing the abrasive grains adhered to the substrate may be interposed between the rough polishing step and the precision polishing step and between the precision polishing step and the profile modifying step.

An end face polishing step of polishing end faces of the substrate may be carried out at any time before the final cleaning step.

Figure 16:
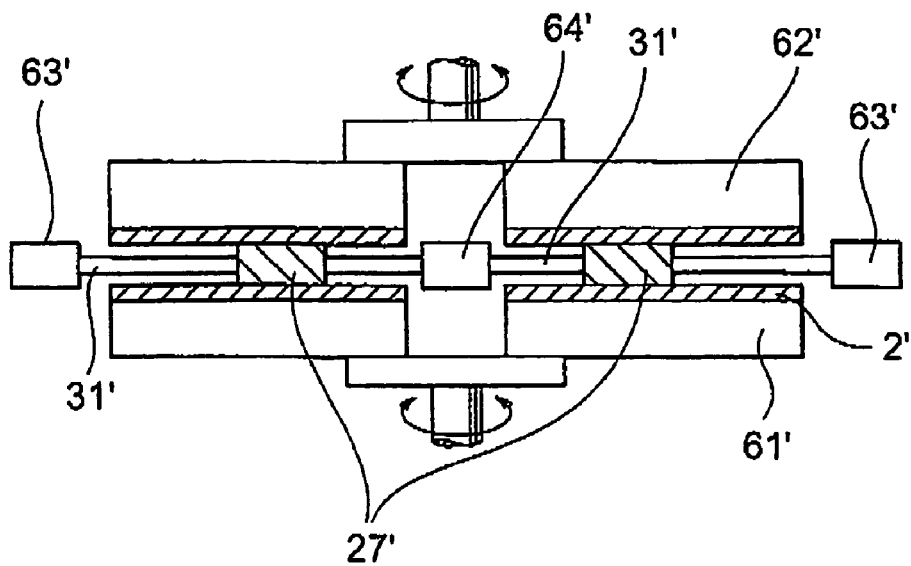
FIG. 16 is a schematic view of an existing single-wafer single-sided polishing apparatus.

As the double-sided polishing, the rough polishing step and the precision polishing step are typically carried out by the use of the double-sided polishing apparatus illustrated in FIG. 16.

The substrate 27' of an angled shape is inserted and held in the holding hole of the carrier 31'. The outer gear of the carrier 31' is engaged with the sun gear 64' and the internal gear 63' of the double-sided polishing apparatus. The carrier 31' is rotated and revolved and the abrasive grains are supplied. The polishing pads 2' adhered to the upper and the lower surface tables rotated reverse to each other perform relative frictional movement with respect to the substrate so that both of the principal surfaces of the substrate 27' are double-sided polished.

The rough polishing step is intended to remove a flaw formed on the principal surface of the substrate during the lapping step and to maintain the flatness obtained in the lapping step. In the rough polishing, polishing is carried out by the use of a relatively large abrasive grain having an average particle size of about 1 to 3 μm. The material of the abrasive grains is appropriately selected depending upon the material of the substrate.

The polishing pad used in the rough polishing step is preferably a hard polisher in order to maintain the flatness.

The precision polishing step is intended to process the substrate, without a surface defect such as a flaw, into a mirror surface. In the precision polishing step, polishing is carried out by the use of a relatively small abrasive grain having an average particle size of about 1 μm or less (for example, 10 nm to 1 μm). The material of the abrasive grains is appropriately selected depending upon the material of the substrate in the manner similar to that described above. Preferably, colloidal silica is used because the average particle size is small and a smooth substrate surface is obtained.

As the polishing pad used in the precision polishing step, a soft or an ultrasoft polisher is preferable in order to provide a mirror surface.

The flatness data obtained by the flatness measuring step were memorized in a recording medium such as a computer. The measured data memorized are compared with the desired flatness data preliminarily stored to calculate a difference in flatness. In order that the flatness of the substrate has a desired value by removing the difference, the working condition was determined for the measured surface in correspondence to an area where the profile is relatively convex with respect to any reference plane. According to the working condition, the profile is locally modified.

As the desired value, the flatness preferably falls within a range greater than 0 μm and not greater than 1 μm (0.0<flatness≦1 μm), more preferably within a range greater than 0 μm and not greater than 0.5 μm (0.0<flatness≦0.5 μm), further preferably within a range greater than 0 μm and not greater than 0.25 μm (0.0<flatness≦0.25 μm). As the flatness of the substrate becomes smaller in absolute value, the pattern position accuracy when the photomask is produced is improved and the pattern transfer accuracy when the pattern is transferred by the use of the photomask is improved. The desired value can be determined depending upon the pattern position accuracy and the pattern transfer accuracy as required. By providing the profile modifying step of this invention, the desired value of almost any value can be obtained.

The parallelism preferably falls within a range greater than 0 μm and not greater than 2 μm, more preferably within a range greater than 0 μm and not greater than 1 μm, further preferably within a range greater than 0 μm and not greater than 0.5 μm.

In the final cleaning step, chemical (acid or alkali) cleaning, cleaning by a detergent, pure water, or ultra-pure water, wet cleaning by functional water such as hydrogen water, and dry cleaning such as UV (ultraviolet) irradiation or ozone treatment can be carried out. Depending upon an object to be removed, one or a plurality of the above-mentioned techniques are selected.

EXAMPLE 3

1) Rough Polishing Step (S201)

Preparation was made of synthetic quartz glass substrates (6 inch×6 inch) after subjected to chamfering at its end faces and lapping by a double-sided lapping apparatus. The glass substrates, 12 in number, were set in the above-mentioned double-sided polishing apparatus and subjected to a rough polishing step in the following polishing condition. A working load and a polishing time were appropriately adjusted Polishing Solution: cerium oxide (average particle size: 2-3 μm)+water Polishing Pad: hard polisher (urethane pad)

After completion of the rough polishing step, the glass substrates were dipped in a cleaning tank (applied with an ultrasonic wave) to be cleaned in order to remove abrasive grains adhered to the glass substrates.

2) Precision Polishing Step (S202)

The glass substrates, 12 in number, were set in the above-mentioned double-sided polishing apparatus and subjected to a precision polishing step in the following polishing condition. A working load and a polishing time were appropriately adjusted.

Polishing Solution: cerium oxide (average particle size: 1 μm)+water

Polishing Pad: soft polisher (suede type)

After completion of the precision polishing step, the glass substrates were dipped in a cleaning tank (applied with an ultrasonic wave) to be cleaned in order to remove abrasive grains adhered to the glass substrates.

3) Flatness Measuring Step (S203)

Among the 12 glass substrates thus obtained, one of the glass substrates was extracted. For the one glass substrate, the flatness of one principal surface was measured by a flatness measuring equipment (FM200 manufactured by Tropel). As a result, the substrate profile was convex and the flatness was 0.97 μm.

The surface roughness of the glass substrates was measured by an atomic force microscope. As a result, the average surface roughness Ra was 0.25 nm.

For all of the 12 substrates and for both of the opposite principal surfaces, the measurement of the flatness was carried out in the similar manner. The measurement data were stored in a computer.

4) Profile Modifying Step (S204)

Figure 14:
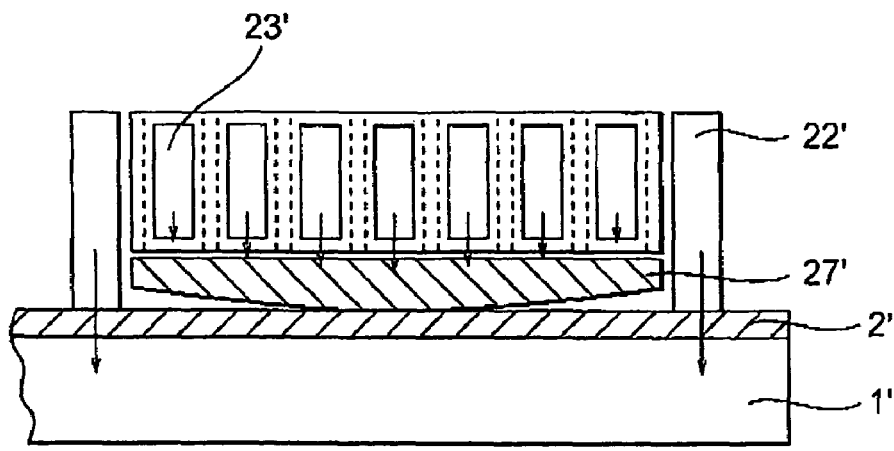
FIG. 14 is a schematic view of a substrate profile modifying section.

Next, the measured data of the flatness stored in the computer were compared with a desired flatness of 0.56 μm (concave). A difference in flatness was calculated by the computer and the working condition was determined. The profile modifying step in this example was carried out by the single-wafer single-sided polishing method in FIG. 14. The number of the pressing members 23 in FIG. 14 was equal to 36 (6×6) disposed at equal intervals with respect to the substrate having a size of 6 inch×6 inch. The pressing member is connected to a cylinder capable of transmitting a pressure. Furthermore, an electromagnetic valve is independently used. Thus, the pressure can be set by an electronic regulator.

Figure 18:
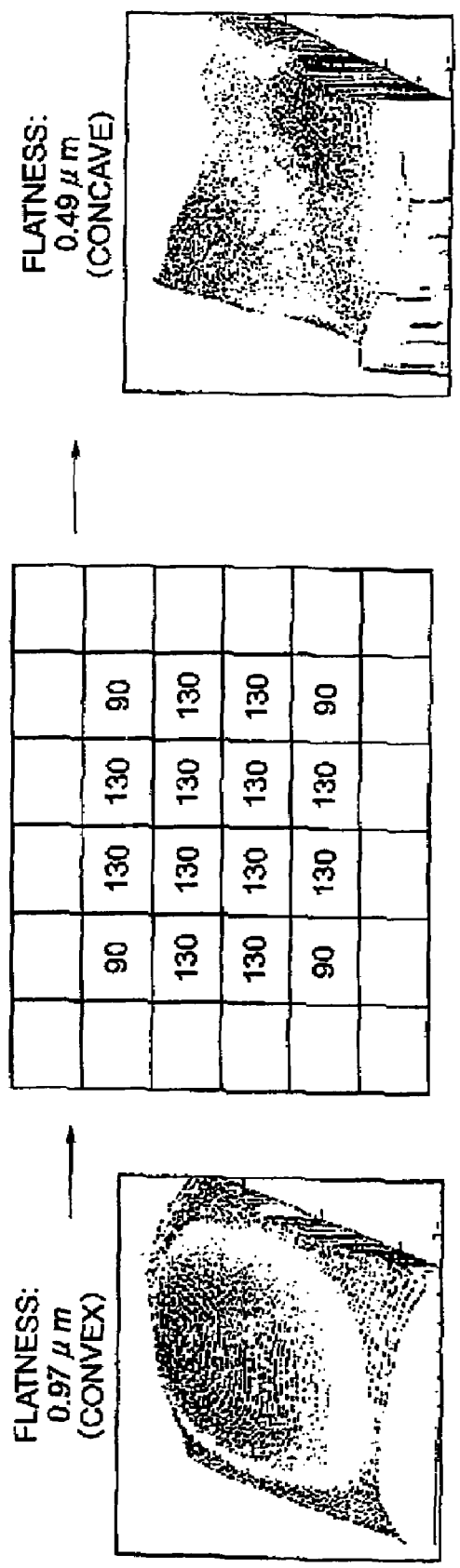
FIG. 18 is a view showing a polishing condition.

The specific polishing condition is shown in FIG. 18 and in the following. Since the substrate before modifying the profile was convex, the pressure was higher in the center portion of the substrate.

Pressure of Retainer Ring: 7.5 g/cm$^2$

Polishing Solution: colloidal silica (average particle size: 100 nm)+water

Polishing Pad: ultrasoft polisher (suede type)

Polishing Time: 60 minutes

5) Final Cleaning Step (S205)

After completion of the profile modifying step, the glass substrates were dipped in a cleaning tank (applied with an ultrasonic wave) to be cleaned in order to remove abrasive grains adhered to the glass substrates.

For the glass substrates thus obtained, the flatness was measured by the use of a measuring equipment similar to that mentioned above. As a result, the flatness was 0.49 μm (concave).

The surface roughness was measured also. As a result, the surface roughness Ra after the precision polishing step was equal to 0.23 nm.

For the other principal surface not yet subjected to modification of the profile and the remaining 11 glass substrates, (4) Profile Modifying Step and (5) Final Cleaning Step were carried out to produce the glass substrates. As a result, all of the 12 glass substrates had a flatness within a range not greater than 0.5 μm in absolute value. Thus, the glass substrates having a high flatness were obtained.

For all of the 12 glass substrates, the parallelism was measured by a parallelism meter (ZYGO Interferometer). As a result, the parallelism was 0.8 μm or less.

EXAMPLE 4

After 2) Precision Polishing Step in Example 3, an ultrahigh precision polishing step was carried out in the following condition. A working load and a polishing time were appropriately adjusted.

Polishing Solution: colloidal silica (average particle size 100 nm)+water
Polishing Pad: ultrasoft polisher (suede type)

After completion of the ultrahigh precision polishing step, the glass substrates were dipped in a cleaning tank (applied with an ultrasonic wave) to be cleaned in order to remove abrasive grains adhered to the glass substrates.

Among the 12 glass substrates thus obtained, one of the glass substrates was extracted. For the one glass substrate, the flatness of one principal surface was measured by a flatness measuring equipment (FM200 manufactured by Tropel). As a result, the substrate profile was concave and the flatness was 0.68 μm (concave).

The surface roughness of the glass substrates was measured by an atomic force microscope. As a result, the average surface roughness Ra was 0.18 nm.

For all of the 12 substrates and for both of the opposite principal surfaces, the measurement of the flatness was carried out in the similar manner. The measurement data were stored in a computer.

Next, the measured data of the flatness stored in the computer were compared with a desired flatness of 0.25 μm (concave). A difference in flatness was calculated by the computer and the working condition was determined. In the manner similar to that mentioned above, the profile modifying step was carried out by the single-wafer single-sided polishing method in FIG. 14.

The specific polishing condition is shown in FIG. 19 and in the following. Since the substrate before modifying the profile was concave, the pressure was higher in the corner portions and the peripheral portion of the substrate.

Pressure of Retainer Ring: 7.5 g/cm$^2$
Polishing Solution: colloidal silica (average particle size: 100 nm)+water
Polishing Pad: ultrasoft polisher (suede type)
Polishing Time: 20 minutes After completion of the profile modifying step, the glass substrates were dipped in a cleaning tank (applied with an ultrasonic wave) to be cleaned in order to remove abrasive grains adhered to the glass substrates.

For the glass substrates thus obtained, the flatness was measured by the use of a measuring equipment similar to that mentioned above. As a result, the flatness was 0.23 μm (concave).

The surface roughness was measured also. As a result, the surface roughness Ra after the precision polishing step was equal to 0.18 nm.

For the other principal surface not yet subjected to modification of the profile and the remaining 11 glass substrates, the profile modifying step and the final cleaning step were carried out to produce the glass substrates. As a result, all of the 12 glass substrates had a flatness within a range not greater than 0.25 μm in absolute value. Thus, the glass substrates having a high flatness were obtained.

For all of the 12 glass substrates, the parallelism was measured by a parallelism meter (ZYGO interferometer). As a result, the parallelism was 0.8 μm or less.

COMPARATIVE EXAMPLE 2

Glass substrates after completion of the precision polishing step by the double-sided polishing method were prepared without carrying out 3) Flatness Measuring Step, 4) Profile Modifying Step, and 5) Final Cleaning Step in Example 3. For all of the 12 glass substrates, the flatness was measured. As a result, the flatness was 1.0 μm (concave) to 1.5 μm (convex). Thus, the profile was different and the fluctuation in flatness was large.

EXAMPLE 5

Glass substrates were prepared in the manner similar to Example 3 except that sodium hydroxide (NaOH) was added to the polishing solution used in 4) Profile Modifying Step so that the polishing solution had a pH value of 11.2.

By addition of sodium hydroxide to the polishing solution used in the profile modifying step so as to provide an etching action, the polishing time can be shortened by 10% to 20%. As a result, the productivity was improved. The glass substrates thus obtained had a same level in surface roughness, flatness, and parallelism.

Evaluation after Production of Photomask Blank and Photomask

On one principal surface of the glass substrate in each of Examples 3-5 and Comparative Example 2, a chromium nitride film, a chromium carbide film, and a chromium oxide nitride (oxynitride) film were deposited by sputtering to a total thickness of 900 angstroms to produce a photomask blank. Similarly, on one principal surface of the glass substrate, a nitrogenated molybdenum silicide film was deposited by sputtering to a thickness of 800 angstroms to produce a phase shift mask blank.

Furthermore, a resist film was formed on the above-mentioned film by spin coating. Through a mask having a desired pattern, exposure and development were carried out. Thus, a photomask and a phase shift mask each of which has a desired pattern were produced.

The pattern position accuracy of each of the photomask and the phase shift mask was compared with the reference pattern data. As a result, the photomask and the phase shift mask obtained by the use of the glass substrate in each of Examples 2 and 3 had an excellent pattern position accuracy. However, the photomask and the phase shift mask obtained by the use of the glass substrate in Comparative Example had an unstable pattern position accuracy with respect to the reference pattern data and exhibited an unfavorable result.

REFERENCE EXAMPLE

Electronic device substrates were produced in the manner similar to Example 3 except that 1) Rough Polishing Step was not carried out.

For the glass substrates prior to 4) Profile Modifying Step, the surface roughness Ra and the flatness were measured. As a result, the average surface roughness Ra was 0.27 nm which was substantially equal to that in Example 3. However, the substrate profile was convex and the flatness exceeded 2 μm.

As a result, in order to obtain the flatness substantially equivalent to that of Example 3 by 4) Profile Modifying Step, the polishing time in the profile modifying step is increased to about twice. Thus, the productivity was significantly decreased.

Thus, it will be understood that, by carrying out the double-sided polishing step in a plurality of stages including the rough polishing step using a relatively large abrasive grain and intended to maintain the flatness obtained in the lapping step and to remove a flaw formed on the substrate during the lapping step and the precision polishing step using a relatively small abrasive grain and intended to process the substrate into a mirror surface, the electronic device substrates having a high smoothness and a high flatness can be obtained with high productivity.

According to this invention, first, it is possible to provide a high-flatness electronic device substrate having a flatness not greater than 0.25 μm corresponding to a design rule of a next-generation semiconductor integrated circuit, a mask blank, and a transfer mask.

Second, it is possible to provide a novel polishing apparatus and a novel polishing method for reliably obtaining a high-flatness electronic device substrate having a flatness not greater than 0.25 μm.

Third, it is possible to provide a method of producing an electronic device substrate, which is capable of reliably obtaining, at a high yield, a high-flatness electronic device substrate having a flatness not greater than 0.25 μm corresponding to a design rule of a next-generation semiconductor integrated circuit, and methods of producing a mask blank and a transfer mask, which are capable of improving a pattern position accuracy when the transfer mask is produced by the use of the electronic device substrate and a pattern transfer accuracy during exposure of the pattern. Thus, this invention provides a remarkable effect industrially effective.

What is claimed is:

1. A method of manufacturing a mask blank by forming, over a principal surface of a glass substrate, a thin film for transferring a pattern onto an object, the method comprising the steps of:
   polishing the principal surface of the glass substrate;
   measuring a flatness and a surface profile on the principal surface of the glass substrate to obtain measured data;
   locally modifying a flatness and a profile of the principal surface on the basis of the measured data at a convex portion projected relative to a reference surface, so that the principal surface has a convex shape or a concave shape and has a desired flatness;
   forming, over the principal surface, the thin film that causes an optical change to exposure of light and that has a tensile stress when the principal surface has the convex shape and has a compressive stress when the principal surface has the concave shape, by carrying out sputtering, so that the flatness of the mask blank has a variation resulting from a film stress of the thin film and is not greater than 1 micron meter.

2. A method as claimed in claim 1, wherein the locally modifying step is carried out by etching.

3. A method as claimed in claim 2, wherein the etching is carried out by supplying a dry etching gas which includes carbon fluoride onto the glass substrate.

4. A method as claimed in claim 1, wherein the locally modifying step is executed by the use of a polishing apparatus that comprises:
   a surface table rotatably supported, a polishing pad formed on the surface table, abrasive supplying means for supplying an abrasive to a surface of the polishing pad, substrate holding means for holding a substrate on the polishing pad, and substrate pressing means for pressing the substrate held on the polishing pad by the substrate holding means to thereby polish a substrate surface, the substrate pressing means having a plurality of pressing members adapted to individually and desirably press a plurality of divided regions of the substrate surface, each pressing member having pressure control means capable of individually controlling a pressure applied to each corresponding one of the divided regions.

5. A method as claimed in claim 4, wherein the locally modifying step is carried out by the use of the polishing apparatus by relatively strongly pressing a convex region projected relative to a reference surface from a back surface of the glass substrate by the substrate pressing means as compared with the remaining regions and by polishing the principal surface of the glass substrate.

6. A method of manufacturing a transferring mask by pattering the mask blank claimed in claim 5 to form a transferring pattern over the glass substrate.

* * * * *